(12) United States Patent
Kim et al.

(10) Patent No.: US 10,270,418 B2
(45) Date of Patent: Apr. 23, 2019

(54) IMPEDANCE MATCHING METHOD AND IMPEDANCE MATCHING SYSTEM

(71) Applicant: MSK KOREA LTD., Gyeonggi-do (KR)

(72) Inventors: Jae-Hyun Kim, Daejeon (KR); Sang-Won Lee, Daejeon (KR)

(73) Assignee: MKS KOREA LTD., Gyeonggi-do (KR)

( * ) Notice: Subject to any disclaimer, the term of this patent is extended or adjusted under 35 U.S.C. 154(b) by 0 days.

(21) Appl. No.: 15/080,052

(22) Filed: Mar. 24, 2016

(65) Prior Publication Data

US 2016/0204757 A1    Jul. 14, 2016

Related U.S. Application Data

(63) Continuation of application No. PCT/KR2014/007522, filed on Aug. 13, 2014.

(30) Foreign Application Priority Data

Sep. 30, 2013  (KR) .................. 10-2013-0116201

(51) Int. Cl.
H03H 7/40    (2006.01)
(52) U.S. Cl.
CPC .................................... H03H 7/40 (2013.01)
(58) Field of Classification Search
CPC ........................................................ H03H 7/40
USPC ................................................ 333/32, 17.1
See application file for complete search history.

(56) References Cited

U.S. PATENT DOCUMENTS

| | | | |
|---|---|---|---|
| 5,654,679 A | 8/1997 | Mavretic et al. |
| 5,936,481 A | 8/1999 | Fujii |
| 7,199,678 B2 | 4/2007 | Matsuno |
| 7,642,879 B2 | 1/2010 | Matsuno |
| 7,831,226 B2 | 11/2010 | Kwon et al. |
| 8,053,991 B2 | 11/2011 | Kim et al. |
| 8,203,859 B2 | 6/2012 | Omae et al. |

(Continued)

FOREIGN PATENT DOCUMENTS

| | | |
|---|---|---|
| CN | 1773848 A | 5/2006 |
| CN | 1773848 B | 5/2010 |

(Continued)

OTHER PUBLICATIONS

International Search Report for Application No. PCT/KR2014/007522 dated Dec. 16, 2014.

(Continued)

*Primary Examiner* — Stephen E. Jones
*Assistant Examiner* — Samuel S Outten
(74) *Attorney, Agent, or Firm* — Jenkins, Wilson, Taylor & Hunt, P.A.

(57) ABSTRACT

An impedance matching device and an impedance matching method. A variable reactance impedance matching network is disposed between a variable frequency RF power source varying a driving frequency and a load. An impedance matching method of the variable reactance impedance matching network includes controlling variation amount of capacitance or reactance of a variable reactive component of the impedance matching network as a function of a difference between a target driving frequency $f_t$ and the driving frequency.

25 Claims, 17 Drawing Sheets

(56) References Cited

U.S. PATENT DOCUMENTS

| | | | |
|---|---|---|---|
| 8,575,843 B2 | 11/2013 | Moore et al. | |
| 9,111,718 B2 | 8/2015 | Merte | |
| 9,378,929 B2 | 6/2016 | Maeda et al. | |
| 2006/0151591 A1* | 7/2006 | Matsuno | H03H 7/40 235/91 G |
| 2006/0220573 A1 | 10/2006 | Kotani et al. | |
| 2008/0158927 A1 | 7/2008 | Omae et al. | |
| 2011/0140607 A1* | 6/2011 | Moore | A61B 18/042 315/111.21 |
| 2011/0303635 A1 | 12/2011 | Takahashi | |
| 2014/0345802 A1 | 11/2014 | Umehara et al. | |

FOREIGN PATENT DOCUMENTS

| | | |
|---|---|---|
| JP | 2011-521735 A | 7/2011 |
| JP | 4887197 B2 | 2/2012 |
| JP | 4975291 B2 | 7/2012 |
| JP | 2013-182966 A | 9/2013 |
| JP | 5595134 B2 | 9/2014 |
| KR | 10-0429930 B1 | 6/2004 |
| KR | 10-0785079 B1 | 12/2007 |
| KR | 10-0870121 B1 | 11/2008 |
| KR | 10-2013-0047532 A | 5/2013 |
| WO | WO 2009/146439 A1 | 12/2009 |
| WO | WO 2012/159620 A2 | 11/2012 |
| WO | WO 2013/088723 A1 | 6/2013 |

OTHER PUBLICATIONS

IPRP with Written Opinion for Application No. PCT/KR2014/007522 dated Apr. 5, 2016.
Korean Office Action for Application No. 10-2013-0116201 dated Feb. 25, 2015.
Korean Grant of Patent for Application No. 10-2013-0116201 dated Jul. 22, 2015.
Extended European Search Report for Application No. 14847544.5 dated Apr. 26, 2017.
Japanese Office Action for Application No. 2016-545669 dated Oct. 30, 2018.

* cited by examiner

IMPEDANCE MATCHING METHOD AND IMPEDANCE MATCHING SYSTEM

CROSS-REFERENCE TO RELATED APPLICATIONS

This application is a continuation of and claims priority to PCT/KR2014/007522 filed on Aug. 13, 2014, which claims priority to Korea Patent Application No. 10-2013-0116201 filed on Sep. 30, 2013, the entireties of which are both hereby incorporated by reference herein.

BACKGROUND

1. Technical Field

The disclosure described herein generally relates to RF power systems and, more particularly, to an RF power system including a variable frequency RF power source.

2. Description of Related Art

In a plasma processing field such as manufacturing of semiconductors or flat panel displays, an RF power generator supplies RF power to a load to discharge capacitively coupled or inductively coupled plasma into a plasma chamber.

The load is a time-dependent dynamic load including plasma. Due to the dynamic load, there is a need for a method of transferring maximum power to the dynamic load by minimizing a reflection wave reflected from a load between the RF power generator and the dynamic load.

Conventionally, two methods have been used for impedance matching between the RF power generator and the load. One of the methods is that a separate impedance matching network including variable elements is disposed between the RF power generator and the load. The other method is that impedance matching is performed by varying a frequency of the RF power generator.

In the case where a variable element impedance matching network is included, the impedance matching network uses at least two variable reactive elements. The variable reactive element may be a variable capacitor or a variable inductor. Conventionally, the variable reactive element is driven by a motor. Conventionally, a maximum/minimum ratio of the variable reactive element is 10 or greater, which is great enough to allow the variable element impedance matching network to perform impedance matching on a wide range of load impedance. Thus, even when a state of plasma is extremely changed, the variable element impedance matching network may perform impedance matching. However, due to driving speed of the motor, the variable element impedance matching network requires matching time of hundreds of milliseconds to several seconds.

On the other hand, when impedance matching is performed by frequency turning or frequency variation, a conventional frequency variable range is about 10 percent. That is, an impedance range of a load, where impedance matching is possible, is very narrow. Therefore, impedance matching cannot be performed by frequency tuning when a state of plasma is extremely changed. In the meantime, matching time reaching impedance matching is several microseconds (microsec) to several milliseconds (millisec), which is very short.

As one of plasma processing processes, atomic layer deposition (ALD) requires repetition of short process steps. In addition, a through silicon via (TSV) process requires repetition of a deposition process and an etching process. A recent deposition or etching process employs a multi-step recipe in which a process condition is changed while keeping RF power. In order to satisfy such a new process condition, an RF power generator and an impedance matching network must perform impedance matching in tens of milliseconds (millisec) or less. Especially, when pulse plasma processing is used, the impedance matching should be performed within several microseconds to tens of microseconds or less. Accordingly, there is a need for a new impedance matching method in which reflected power is reduced within predetermined range in several microseconds to tens of microseconds and a driving frequency is fixed even though a range of plasma load is wide.

SUMMARY

A subject matter of the present disclosure is to provide an impedance matching method and system which performs high-speed impedance matching.

A variable reactance impedance matching network according to an embodiment of the present disclosure is disposed between a variable frequency RF power source varying a driving frequency (f) and a load. The impedance matching method may include controlling variation amount of capacitance or inductance of a variable reactive component of the impedance matching network as a function of a difference between a target driving frequency $f_t$ and the driving frequency f.

In an embodiment of the present disclosure, the variable reactive component may include a first capacitor and a second capacitor, and variation amounts $dC_1$ and $dC_2$ of first capacitance $C_1$ of the first capacitor and second capacitance $C_2$ of the second capacitor satisfy a condition as below, $$\begin{pmatrix} dC_1 \\ dC_2 \end{pmatrix} = -\frac{d\omega}{\omega}\begin{pmatrix} C_1 \\ C_2 \end{pmatrix}$$

where $d\omega$ represents a difference between a target driving angular frequency ($\omega_t = 2\pi f_t$) and a driving angular frequency ($\omega = 2\pi f$).

In an embodiment of the present disclosure, the variable reactive component may include a first capacitor and a second capacitor, and variation amounts $dC_1$ and $dC_2$ of first capacitance $C_1$ of the first capacitor and second capacitance $C_2$ of the second capacitor satisfy a condition as below, $$\begin{pmatrix} dC_1 \\ dC_2 \end{pmatrix} = -\frac{d\omega}{\omega}\begin{pmatrix} K_1 \\ K_2 \end{pmatrix}$$

where $K_1$ is a constant, $K_2$ is a constant, and $d\omega$ represents a difference between a target driving angular frequency ($\omega_t = 2\pi f_t$) and a driving angular frequency ($\omega = 2\pi f$).

In an embodiment of the present disclosure, the impedance matching network may include at least one of L-type, inverted L-type, T-type, and π-type.

In an embodiment of the present disclosure, the variation amount of the capacitance or the inductance of the variable reactive component may be controlled to have a negative value when a difference between a target driving frequency $f_t$ and the driving frequency f has a positive value. The variation amount of the capacitance or the inductance of the variable reactive component may be controlled to have a positive value when a difference between a target driving frequency $f_t$ and the driving frequency f has a negative value.

In an embodiment of the present disclosure, the variation amount of the capacitance or the inductance of the variable reactive component may be additionally dependent on a function of a reflection coefficient or impedance for impedance matching.

In an embodiment of the present disclosure, the variable reactive component may include a first capacitor and a second capacitor, and variation amounts $dC_1$ and $dC_2$ of first capacitance $C_1$ of the first capacitor and second capacitance $C_2$ of the second capacitor satisfy a condition as below, $$\begin{pmatrix} dC_1 \\ dC_2 \end{pmatrix} = \begin{pmatrix} A \\ B \end{pmatrix} - \frac{d\omega}{\omega}\begin{pmatrix} C_1 \\ C_2 \end{pmatrix}$$

where A and B are parameter depending on a reflection coefficient or impedance, and $d\omega$ represents a difference between a target driving angular frequency ($\omega_t=2\pi f_t$) and a driving angular frequency ($\omega=2\pi f$).

In an embodiment of the present disclosure, the variation amounts $dC_1$ and $dC_2$ of the first capacitance $C_1$ of the first capacitor and the second capacitance $C_2$ of the second capacitor may satisfy a condition as below, $$\begin{pmatrix} dC_1 \\ dC_2 \end{pmatrix} = g_1\begin{pmatrix} A \\ B \end{pmatrix} - g_2\frac{d\omega}{\omega}\begin{pmatrix} C_1 \\ C_2 \end{pmatrix}$$

where $g_1$ represents a first weighting function and $g_2$ represents a second weighting function. The first weighting function may have a large value when a reflection coefficient is large and has a small value when the reflection coefficient is small, and the second weighting function may have a small value when the reflection coefficient is large and has a large value when the reflection coefficient is small.

In an embodiment of the present disclosure, the frequency variable RF power source may perform impedance matching by varying a driving frequency.

In an embodiment of the present disclosure, the frequency variable RF power source may increase the driving frequency when an imaginary part of a reflection coefficient has a positive value and may decrease the driving frequency when the imaginary part of the reflection coefficient has a negative value.

In an embodiment of the present disclosure, the frequency variable RF power source may perform impedance matching by scanning the driving frequency.

In an embodiment of the present disclosure, the step in which the variation amount of the capacitance or the inductance of the variable reactive component is dependent on a function of a reflection coefficient or impedance for impedance matching may include extracting a characteristic vector; transforming a device vector indicating reactance of a variable reactive component into an analysis vector using a predetermined transformation matrix and expressing the characteristic vector on an analysis coordinate system using the analysis vector as a coordinate axis; analyzing the characteristic vector on the analysis coordinate system to extract a displacement vector for impedance matching; transforming the displacement vector into a reduced device vector using the transformation matrix; and extracting variation amount of capacitance or inductance using the reduced device vector.

A control method of an RF system according to an embodiment of the present disclosure may include performing first impedance matching by measuring electrical characteristics at an output of a frequency variable RF power source and varying a driving frequency using the measured electrical characteristics; and disposing an impedance matching network including a variable reactive component between the frequency variable RF power source and a load to changing capacitance or inductance of the variable reactive components. Variation amount of the capacitance or the inductance of the variable reactive component may be given as a function between a target driving frequency $f_t$ and the driving frequency f.

In an embodiment of the present disclosure, the impedance matching network may include at least one of L-type, inverted L-type, T-type, and π-type.

In an embodiment of the present disclosure, the variable reactive component may include a first capacitor and a second capacitor, and variation amounts $dC_1$ and $dC_2$ of first capacitance $C_1$ of the first capacitor and second capacitance $C_2$ of the second capacitor satisfy a condition as below, $$\begin{pmatrix} dC_1 \\ dC_2 \end{pmatrix} = -\frac{d\omega}{\omega}\begin{pmatrix} C_1 \\ C_2 \end{pmatrix}$$

where $d\omega$ represents a difference between a target driving angular frequency ($\omega_t=2\pi f_t$) and a driving angular frequency ($\omega=2\pi f$).

In an embodiment of the present disclosure, the control method may further include calculating a prediction driving frequency $f_p$ and providing the calculated prediction driving frequency $f_p$ to the frequency variable RF power source.

In an embodiment of the present disclosure, the variable reactive component may include a first capacitor and a second capacitor, and a prediction driving angular frequency $\omega_p$ is given as below, $$\omega_p = \omega - \omega\left(\frac{dC_1}{C_1} + \frac{dC_2}{C_2}\right)$$

where $\psi_p$ represents a prediction driving angular frequency ($\omega_p=2\pi f_p$), $\omega$ represents a driving angular frequency ($\omega=2\pi f$), $C_1$ represents first capacitance of the first capacitor, and $C_2$ represents second capacitance of the second capacitor.

In an embodiment of the present disclosure, the variation amount of the capacitance or the inductance of the variable reactive component may be dependent on a function of a reflection coefficient or impedance for impedance matching.

In an embodiment of the present disclosure, the step in which the variation amount of the capacitance or the inductance of the variable reactive component is dependent on a function of a reflection coefficient or impedance for impedance matching may include extracting a characteristic vector; transforming a device vector indicating reactance of a variable reactive component into an analysis vector using a predetermined transformation matrix and expressing the characteristic vector on an analysis coordinate system using the analysis vector as a coordinate axis; analyzing the characteristic vector on the analysis coordinate system to extract a displacement vector for impedance matching; transforming the displacement vector into a reduced device vector using the transformation matrix; and extracting variation amount of capacitance or inductance using the reduced device vector.

In an embodiment of the present disclosure, the variable reactive component may include a first capacitor and a second capacitor, and wherein variation amounts $dC_1$ and $dC_2$ of first capacitance $C_1$ of the first capacitor and second capacitance $C_2$ of the second capacitor satisfy a condition as below, $$\begin{pmatrix} dC_1 \\ dC_2 \end{pmatrix} = \begin{pmatrix} A \\ B \end{pmatrix} - \frac{d\omega}{\omega}\begin{pmatrix} C_1 \\ C_2 \end{pmatrix}$$

where A and B are parameter depending on a reflection coefficient or impedance, and $d\omega$ represents a difference between a target driving angular frequency ($\omega_t=2\pi f_t$) and a driving angular frequency ($\omega=2\pi f$).

In an embodiment of the present disclosure, the variation amounts $dC_1$ and $dC_2$ of the first capacitance $C_1$ of the first capacitor and the second capacitance $C_2$ of the second capacitor may satisfy a condition as below, $$\begin{pmatrix} dC_1 \\ dC_2 \end{pmatrix} = g_1\begin{pmatrix} A \\ B \end{pmatrix} - g_2\frac{d\omega}{\omega}\begin{pmatrix} C_1 \\ C_2 \end{pmatrix}$$

where $g_1$ represents a first weighting function and $g_2$ represents a second weighting function. The first weighting function may have a large value when a reflection coefficient is large and may have a small value when the reflection coefficient is small. The second weighting function may have a small value when the reflection coefficient is large and may have a large value when the reflection coefficient is small.

A variable reactance impedance matching network according to an embodiment of the present disclosure is disposed between a frequency variable RF power source to vary a driving frequency f and a load. An impedance matching method of the variable reactance impedance matching network may include changing capacitance or inductance of a variable reactive component of the impedance matching network such that the frequency variable RF power source is induced to operate at a target frequency driving frequency.

In an embodiment of the present disclosure, variation amount of capacitance or inductance of a variable reactive component of the impedance matching network may be controlled as a function of a difference between a target driving frequency $f_t$ and the driving frequency f.

In an embodiment of the present disclosure, the control method may further include calculating a prediction driving frequency $f_p$ and providing the calculated prediction driving frequency $f_p$ to the frequency variable RF power source.

An RF power system according to an embodiment of the present disclosure includes a frequency variable RF power source and an impedance matching network transferring an output of the frequency variable RF power source to a load. An impedance matching method of the RF power system may include measuring a first electrical characteristic at an output terminal of the frequency variable RF power source checking an impedance matching state using the first electrical characteristics by the frequency variable RF power varying a driving frequency of the frequency variable RF power source; measuring a second electrical characteristic by the impedance matching network; checking an impedance matching state using the second electrical characteristic by the impedance matching network and checking whether a driving frequency is a target driving frequency; calculating first variation amount of inductance or capacitance of variable reactive component for impedance matching when impedance matching is not performed at the impedance matching network; calculating second variation amounts of inductance or capacitance of the variable reactive component for varying the driving frequency at the impedance matching network when the driving frequency does not match a target driving frequency; and calculating the total variation amounts caused by the first variation amount and the second variation amount and controlling the variable reactive component using the total variation amounts.

In an embodiment of the present disclosure, the first variation amount may be given as a function of a difference between a driving frequency and a target driving frequency.

In an embodiment of the present disclosure, a driving vector to control the variable reactive component or total amount may include a multiplication of the first variation amount by a first weighting function and a multiplication of the second variation amount by a second weighting function. The first weighting function has a large value when a reflection coefficient is large and has a small value when the reflection coefficient is small. The second weighting function has a small value when a reflection coefficient is large and has a large value when the reflection coefficient is small.

In an embodiment of the present disclosure, the step of varying a driving frequency of the frequency variable RF power source may include calculating a first reflection coefficient using the first electrical characteristic; and increasing a frequency when an imaginary part of the first reflection coefficient has a positive value and decreasing a frequency when the imaginary part of the first reflection coefficient has a negative value.

In an embodiment of the present disclosure, the step of calculating first variation amount may include extracting a characteristic vector; transforming a device vector indicating reactance of a variable reactive component into an analysis vector using a predetermined transformation matrix and expressing the characteristic vector on an analysis coordinate system using the analysis vector as a coordinate axis; analyzing the characteristic vector on the analysis coordinate system to extract a displacement vector for impedance matching; transforming the displacement vector into a reduced device vector using the transformation matrix; and extracting variation amount of capacitance or inductance of the reduced device vector.

An RF power system according to an embodiment of the present disclosure includes a frequency variable RF power source and an impedance matching network transferring an output of the frequency variable RF power source to a load. An impedance matching method of the RF power system may include measuring a first electrical characteristic at an output terminal of the frequency variable RF power source; checking an impedance matching state using the first electrical characteristic by the frequency variable RF power source; varying a driving frequency of the frequency variable RF power source; checking whether the driving frequency is a target driving frequency; calculating first variation amount of inductance or capacitance of a variable reactive component for impedance matching when impedance matching is not performed; calculating second variation amount of inductance or capacitance of a variable reactive component for varying a driving frequency when the driving frequency does not match the target driving frequency; and calculating total variation amount of the first variation amount and the second variation amount and controlling the variable reactive component using the total variation amount.

In an embodiment of the present disclosure, the first variation amount may be given as a function of a difference between a driving frequency and a target driving frequency.

In an embodiment of the present disclosure, the second variation amount may be a function depending on impedance or a reflection coefficient.

In an embodiment of the present disclosure, a driving vector to control the variable reactive component or total amount may include a multiplication of the first variation amount by a first weighting function and a multiplication of the second variation amount by a second weighting function. The first weighting function has a large value when a reflection coefficient is large and has a small value when the reflection coefficient is small. The second weighting function has a small value when a reflection coefficient is large and has a large value when the reflection coefficient is small.

In an embodiment of the present disclosure, the step of varying a driving frequency of the frequency variable RF power source may include calculating a first reflection coefficient using the first electrical characteristic; and increasing a frequency when an imaginary part of the first reflection coefficient has a positive value and decreasing a frequency when the imaginary part of the first reflection coefficient has a negative value.

In an embodiment of the present disclosure, the step of calculating first variation amount may include extracting a characteristic vector; transforming a device vector indicating reactance of a variable reactive component into an analysis vector using a predetermined transformation matrix and expressing the characteristic vector on an analysis coordinate system using the analysis vector as a coordinate axis; analyzing the characteristic vector on the analysis coordinate system to extract a displacement vector for impedance matching; transforming the displacement vector into a reduced device vector using the transformation matrix; and extracting variation amount of capacitance or inductance of the reduced device vector.

In an embodiment of the present disclosure, the impedance matching method may further include calculating a prediction driving frequency $f_p$ and providing the calculated prediction driving frequency $f_p$ to the frequency variable RF power source.

An impedance matching network according to an embodiment of the present disclosure is disposed between RF power source having a predetermined frequency variable range and outputting RF power and a load. The impedance matching network may include at least two variable reactive components. Variation amount of inductance or capacitance of the variable reactive component may be given as a function of a difference between a driving frequency and a target driving frequency.

In an embodiment of the present disclosure, the impedance matching network may further include a matching sensor unit disposed between the impedance matching network the frequency variable RF power source to measure electrical characteristics in a direction of the load by the impedance matching network. The matching sensor unit may calculate impedance or a reflection coefficient using the electrical characteristics and measure a driving frequency transferred to the load.

In an embodiment of the present disclosure, the impedance matching network may further include a power sensor unit disposed between the impedance matching network and the frequency variable RF power source to measure electrical characteristics in a direction of the load by the impedance matching network. The power sensor unit may calculate impedance or a reflection coefficient using the electrical characteristics and receive a driving frequency from the frequency variable RF power source.

In an embodiment of the present disclosure, the impedance matching network may receive electrical characteristics in a direction viewing the load at an output terminal of the frequency variable RF power source from the frequency variable RF power source.

In an embodiment of the present disclosure, the impedance matching network may provide a prediction driving frequency for impedance matching to the frequency variable RF power source.

An RF power system according to an embodiment of the present disclosure may include a frequency variable RF power source having a predetermined frequency variable range and varying a driving frequency to perform impedance matching; and an impedance matching network receiving an output from the frequency variable RF power source and transferring the output to a load. The impedance matching network may change capacitance or inductance of a variable reactive component of the impedance matching network such that the frequency variable RF power source is induced to operate at a target driving frequency.

In an embodiment of the present disclosure, the impedance matching network may further include a matching sensor unit disposed between the impedance matching network the frequency variable RF power source to measure electrical characteristics in a direction of the load by the impedance matching network. The matching sensor unit may calculate impedance or a reflection coefficient using the electrical characteristics and measure a driving frequency transferred to the load.

In an embodiment of the present disclosure, the frequency variable RF power source may further include a power sensor unit disposed between the impedance matching network and the frequency variable RF power source to measure electrical characteristics in a direction of the load by the impedance matching network. The power sensor unit may calculate impedance or a reflection coefficient using the electrical characteristics and receive a driving frequency from the frequency variable RF power source.

In an embodiment of the present disclosure, the impedance matching network may receive electrical characteristics in a direction viewing the load at an output terminal of the frequency variable RF power source from the frequency variable RF power source.

In an embodiment of the present disclosure, the impedance matching network may provide a prediction driving frequency for impedance matching to the frequency variable RF power source.

An electric device according to an embodiment of the present disclosure includes at least two variable reactive components transferring an output of a frequency variable RF power source to a load. Variation amount of inductance or capacitance of the variable reactive component may include a function of a difference between a driving frequency and a target driving frequency of the frequency variable driving RF power source. The target driving frequency may be within a frequency variable range of a frequency variable RF power generator.

An RF power system according to an embodiment of the present disclosure includes a frequency variable RF power source and an impedance matching network transferring an output of the frequency variable RF power source to a load. An impedance matching method of the RF power system may include measuring first electrical characteristics at an output terminal of the frequency variable RF power source; checking an impedance matching state using the first electrical characteristics by the frequency variable RF power; varying a driving frequency of the frequency variable RF power source; measuring a second electrical characteristic by the impedance matching network; checking an impedance matching state using the second electrical characteristic by the impedance matching network; calculating first variation amount of inductance or capacitance of a variable reactive component for impedance matching; and controlling the variable reactive component using the first variation amount.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
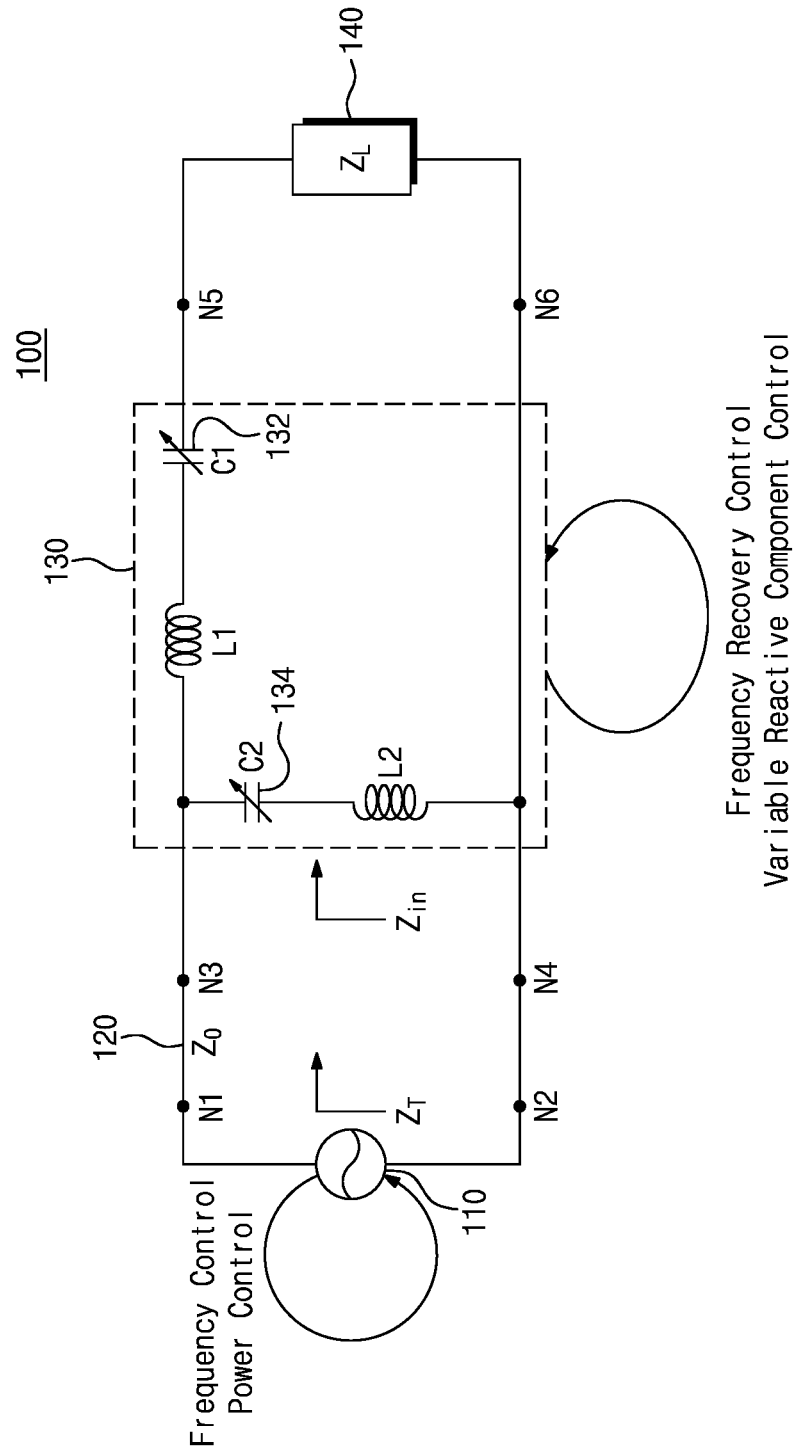
FIG. 1 is a conceptual diagram of an RF power system according to an embodiment of the present disclosure.

Preferred embodiments of the present disclosure will be described below in more detail with reference to the accompanying drawings. The present disclosure may, however, be embodied in different forms and should not be constructed as limited to the embodiments set forth herein. Rather, these embodiments are provided so that this disclosure will be thorough and complete, and will fully convey the scope of the disclosure herein to those skilled in the art. Like numerals refer to like elements throughout the specification.

An impedance matching network according to an embodiment of the present disclosure may be disposed between a frequency variable RF power source and a load to perform impedance matching at a target driving frequency. Thus, the frequency variable RF power source may vary a driving frequency to perform high-speed impedance matching or reduce reflected power within a predetermined range. Even when the frequency variable RF power source performs impedance matching, if a driving frequency and the target driving frequency are different from each other, the impedance matching network may induce the frequency variable RF power to perform impedance matching on the target driving frequency. That is, when the frequency variable RF power source satisfies conditions of impedance matching and the driving frequency and the target driving frequency are different from each other, the impedance matching network may continuously operate to control variable reactive elements such that the impedance matching is performed at the target driving frequency. Accordingly, the frequency variable RF power source varies the driving frequency to perform impedance matching under the varied conditions. As a result, when the driving frequency reaches the target driving frequency and impedance matching is performed, reactance of a variable reactive element of the impedance matching network is fixed to a constant value. This procedure may be repeated in a state where a load varies depending on time.

When the frequency variable RF power source cannot independently perform impedance matching, the impedance matching network may induce the frequency variable RF power source to perform impedance matching on the target driving frequency while performing impedance matching for itself.

More specifically, the frequency variable RF power source minimizes reflected power. When a reflection coefficient is large in a direction where a load is viewed from an input terminal of the impedance matching network, the impedance matching network drives a variable reactive element to perform impedance matching. Thus, the frequency variable RF power source varies a driving frequency to perform impedance matching on impedance that varies depending on the variable reactive element.

In addition, when a reflection coefficient is small in a direction where a load is viewed from an input terminal of the impedance matching network (almost reaches the impedance matching), the impedance matching network may control the variable reactive element to be significantly dependent upon a function of a difference between a driving frequency and a target frequency.

FIG. 1 is a conceptual diagram of an RF power system according to an embodiment of the present disclosure.

Figure 2:
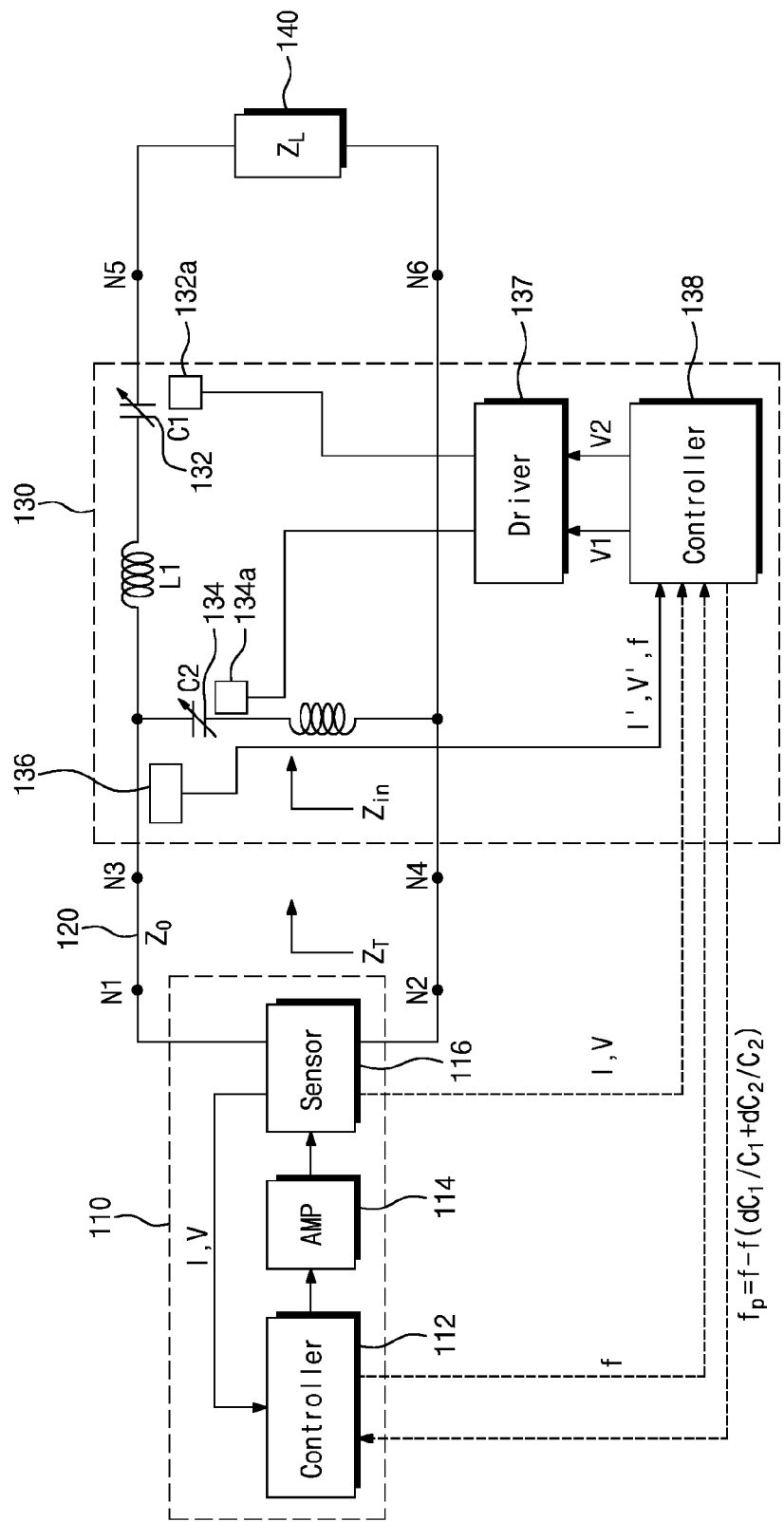
FIG. 2 is a detailed block diagram of the RF power system in FIG. 1.

FIG. 2 is a detailed block diagram of the RF power system in FIG. 1.

Figure 3:
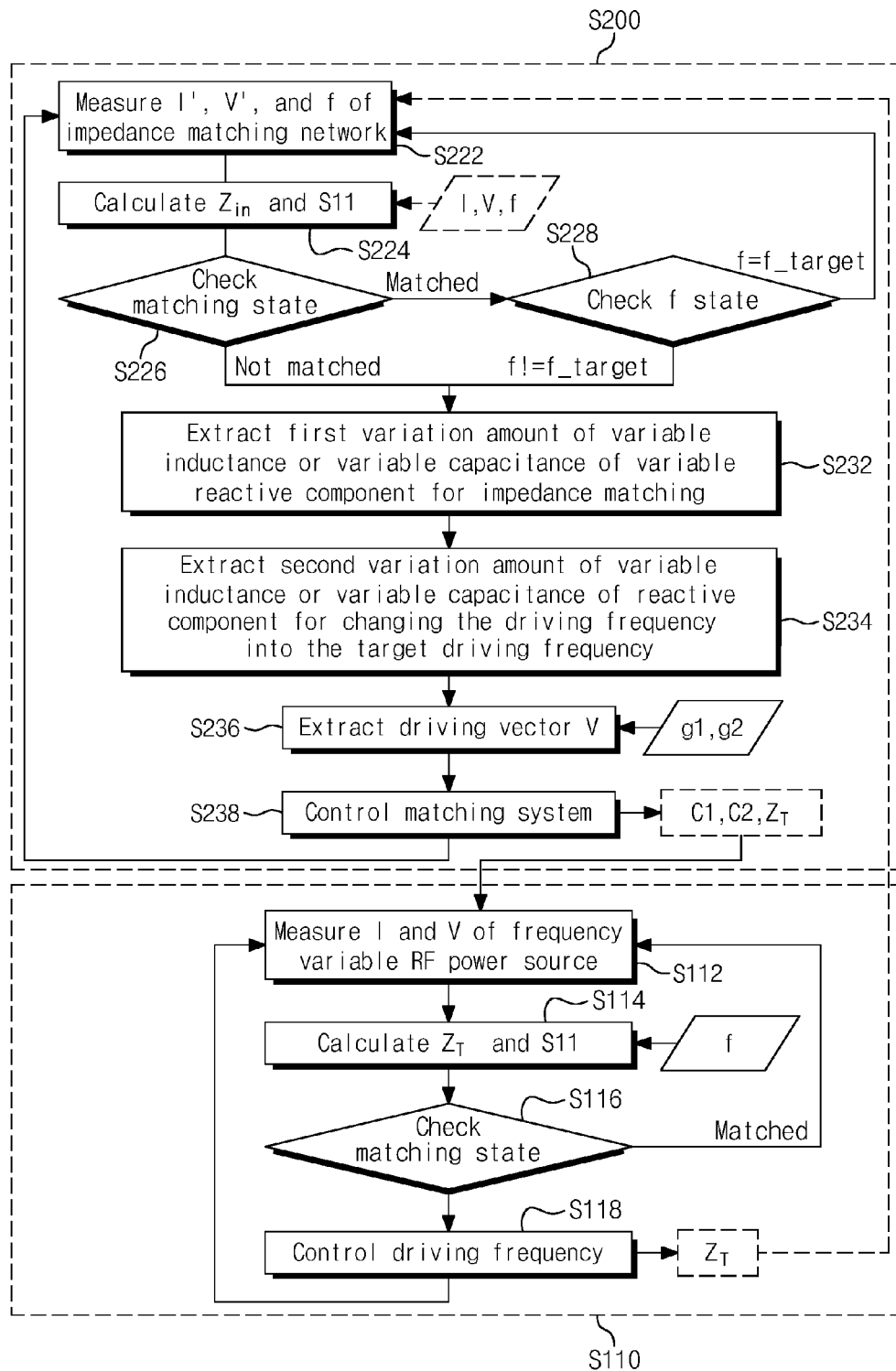
FIG. 3 is a flowchart summarizing a control method of an RF power system according to an embodiment of the present disclosure.

FIG. 3 is a flowchart summarizing a control method of an RF power system according to an embodiment of the present disclosure.

Figure 4:
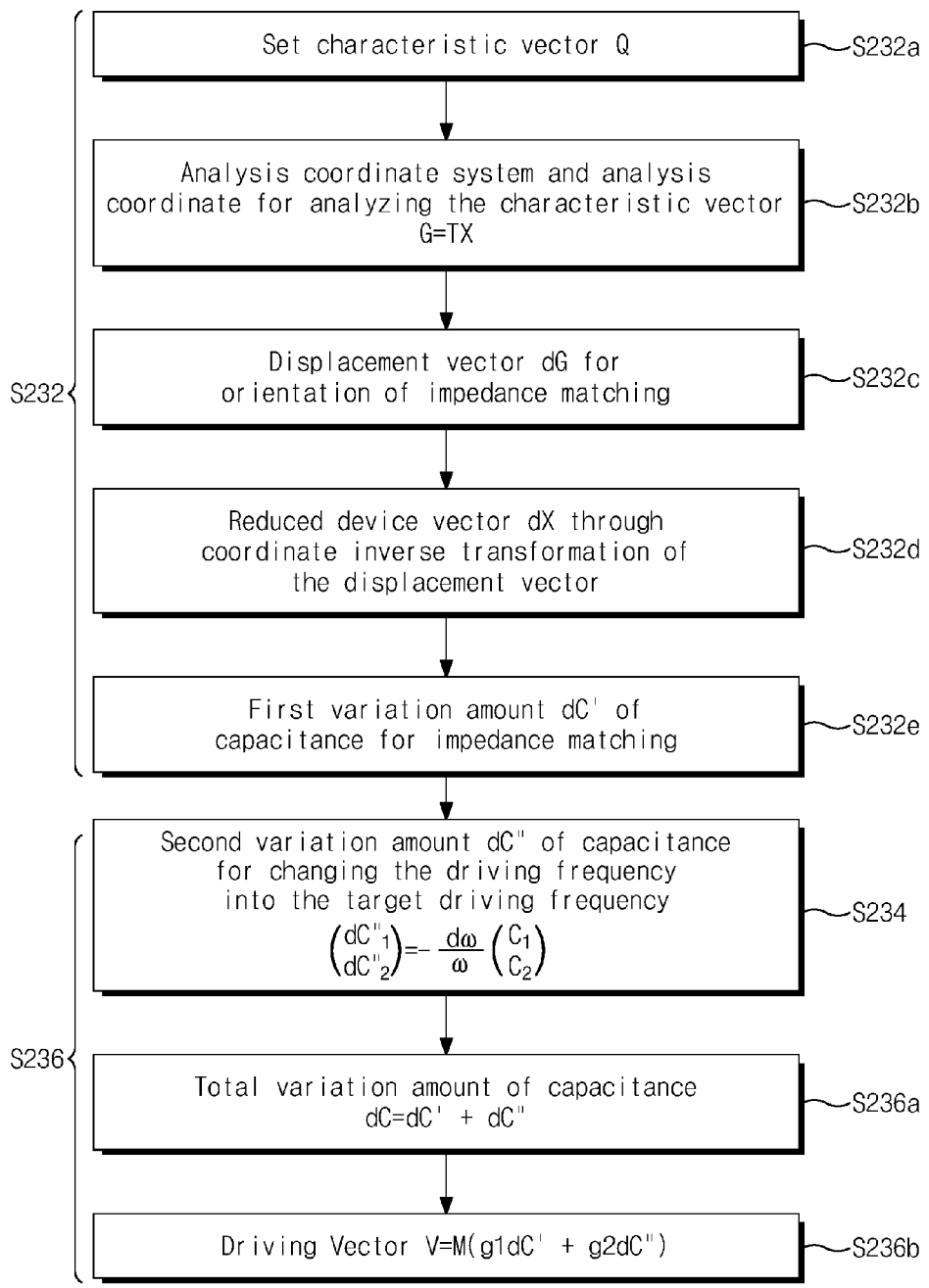
FIG. 4 is a flowchart summarizing an impedance matching method according to an embodiment of the present disclosure.

FIG. 4 is a flowchart summarizing an impedance matching method according to an embodiment of the present disclosure.

Figure 5:
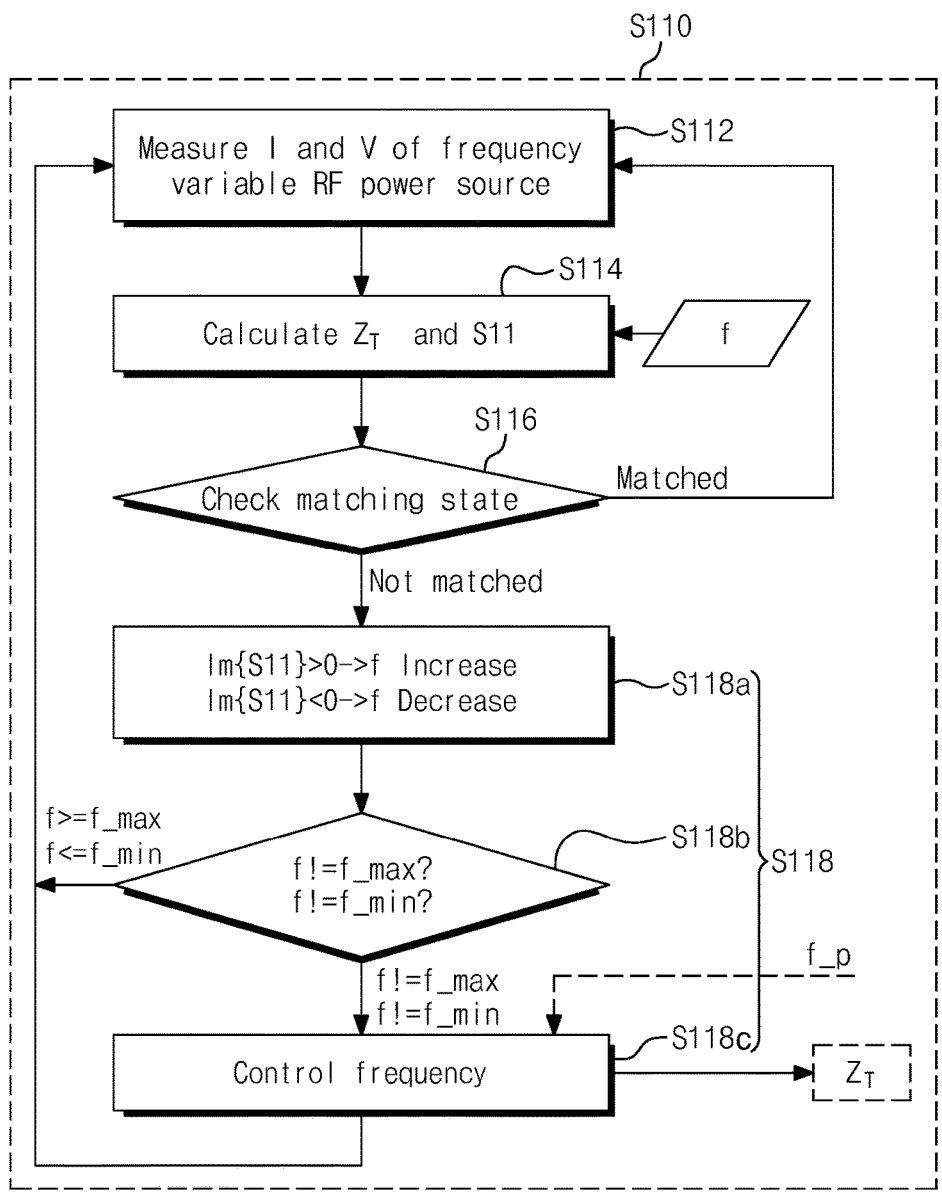
FIG. 5 is a flowchart summarizing a frequency variable impedance matching method according to an embodiment of the present disclosure.

FIG. 5 is a flowchart summarizing a frequency variable impedance matching method according to an embodiment of the present disclosure.

Referring to FIGS. 1 through 5, a frequency variable RF power source 110 transfers RF power to a load 140 through an impedance matching network 130. Conventionally, the load 140 may be a dynamic load such as a plasma load. The frequency variable RF power source 110 may be connected to the impedance matching network 130 through a transmission line 120 having characteristic impedance $Z_O$, and the impedance matching network 130 may be disposed adjacent to the load 140 to transfer RF power to the load 140.

The frequency variable RF power source 110 may include a driving frequency control loop and a power control loop. The frequency variable RF power source 110 may receive set power and transfer the received power to the load 140 through the power control loop. The frequency variable RF power source 110 may measure electrical characteristics of output terminals N1 and N2 to calculate impedance or a reflection coefficient. The frequency variable RF power source 110 may vary a driving frequency f such that the reflection coefficient becomes zero for impedance matching.

The frequency variable RF power source 110 measures electrical characteristics of the output terminals N1 and N2 at high speed to judge an impedance matching state. Thus, the frequency variable RF power source 110 may vary a driving frequency to perform impedance matching irrespective of the impedance matching network 130. The frequency variable RF power source 110 may calculate impedance $Z_T$ of the output terminals N1 and N2. The frequency variable RF power source may include a power sensor unit 116 to measure electrical characteristics of the output terminals N1 and N2, an amplify unit 114, and a control unit 112. A measurement signal or a processed signal of the power sensor unit 116 may be provided to the control unit 112. The control unit 112 may execute a forward power control algorithm or a frequency variable impedance matching algorithm.

In addition, the impedance matching network 130 may independently measure electrical characteristics of input terminals N3 and N4 of the impedance matching network 130 to calculate impedance Zin. There may be a predetermined relationship between the impedance Zin of the input terminals N3 and N4 of the impedance matching network 130 and the impedance $Z_T$ of the output terminals N1 and N2 of the frequency variable RF power source 110.

The impedance matching network 130 includes two variable reactive elements 132 and 134. Reactance of the variable reactive elements 132 and 134 may be inductive reactance or capacitive reactance. The variable reactive elements 132 and 134 mainly employ a variable capacitor. The shown impedance matching network may change into a standard L-type impedance matching network or another type impedance matching network. For impedance matching, the impedance matching network may further include a fixed inductor or a fixed capacitor. Each of the variable reactive elements 132 and 134 may connect a plurality of fixed capacitors in parallel to each other to adjust reactance through a switch.

The impedance matching network 130 may include an impedance matching control algorithm and a frequency recovery algorithm. The impedance matching control algorithm may vary reactance at the variable reactive elements 132 and 134 for impedance matching. The frequency recovery algorithm may vary the reactance of the variable reactive elements 132 and 134 to perform impedance matching at a specific target driving frequency. The impedance matching network may measure independently electrical characteristics of the input terminals N3 and N4 to calculate impedance Zin.

Hereinafter, an operation principle of the RF power system 100 according to an embodiment of the present disclosure will now be described below.

The RF power system 100 includes a frequency variable RF power source 110 and an impedance matching network 130 transferring an output at the frequency variable RF power source 110 to a load 140. An impedance matching method of the RF power system 100 includes measuring first electrical characteristics I and V of output terminals N1 and N2 of the frequency variable RF power source 110 (S112), checking an impedance matching state at the frequency variable RF power 130 using the first electrical characteristics I and V (S116), varying a driving frequency f of the frequency variable RF power source 110 (S118), measuring second electrical characteristics I' and V' at the impedance matching network 130 (S222), checking an impedance matching state at the impedance matching network 130 using the second electrical characteristics I' and V' and checking whether a driving frequency is a target driving frequency (S226 and S228), calculating first variation amounts $dC'_1$ and $dC'_2$ of inductance or capacitance of variable reactive elements 132 and 134 for impedance matching when impedance matching is not performed at the impedance matching network (S232), calculating second variation amounts $dC''_1$ and $dC''_2$ of inductance or capacitance of the variable reactive elements 132 and 134 for varying the driving frequency at the impedance matching network 130 when the driving frequency does not match a target driving frequency (S234), and calculating the total variation amounts $dC_1$ and $dC_2$ caused by the first variation amount and the second variation amount and controlling the variable reactive elements 132 and 134 using the total variation amounts $dC_1$ and $dC_2$ (S236 and S238).

The impedance matching network 130 may be a standard L-type impedance matching network and include a first variable capacitor 132 and a second variable capacitor 134. The first variable capacitor 132 may be connected in series to a load, and the second variable capacitor 134 may be connected in parallel to the load. Each of the first and second variable capacitors 132 and 134 may be a vacuum variable capacitor. The first variable capacitor 132 may include a first driving motor 132a, and the second variable capacitor 134 may include a second driving motor 134a. The first driving motor 132a and the second driving motor 134a may be connected to a motor driving unit 137. An impedance control unit 138 controls the motor driving unit 137 through driving vectors V1 and V2. In addition, the impedance control unit 138 may directly receive the second electrical characteristics I and V or may receive calculated electrical characteristics S11 and Z. A matching sensor unit 136 may measure a driving frequency and provide measured driving frequency to the impedance control unit 138. The impedance control unit 138 may execute at least one of an impedance matching control algorithm and a driving frequency recovery algorithm.

At the impedance matching network 130, the impedance matching control algorithm may obtain variation amounts $dC_1$ and $dC_2$ of variable capacitances $C_1$ and $C_2$ of the first variable capacitor 132 and the second variable capacitor 134 through impedance analysis, as below.

$$\begin{pmatrix} dC_1 \\ dC_2 \end{pmatrix} = \begin{pmatrix} A \\ B \end{pmatrix} \quad \text{Equation (1)}$$

In the Equation (1), $dC_1$ represents variation amount of capacitance $C_1$ of the first variable capacitor 132, $dC_2$ represents variation amount of capacitance $C_2$ of the second variable capacitor 134, and A and B represent parameters decided for impedance matching at a predetermined driving frequency f. The parameters A and B may be given as a function of impedance or a function of a reflection coefficient. The parameters A and B may be obtained by of conventional method.

The impedance matching network 130 perform impedance matching by varying capacitances of the variable reactive components 132 and 134. When the impedance matching network 130 performs impedance matching or assuming that the frequency variable RF power source performs impedance matching by varying a driving frequency, the variation amounts $dC_1$ and $dC_2$ become zero. However, the impedance matching network 130 receives power from the frequency variable RF power source 110. Accordingly, when the impedance matching is performed or a reflection coefficient is zero, a driving frequency f of the frequency variable RF power source may be dependent on impedance $Z_L$ of a load and conditions $C_1$ and $C_2$ of the impedance matching network.

Reactance elements of the variable reactive components 132 and 134 may be expressed by multiplication of a frequency and inductance or multiplication of a frequency and capacitance. Thus, let it be assumed that impedance matching is performed while the load impedance $Z_L$ is fixed. In this case, if a driving frequency is desired to be changed into a target driving frequency while keeping the same reactance, variation amount $d\omega$ of a driving angular frequency and variation amount dC of capacitance or variation amount $d\omega$ of a driving angular frequency and variation amount of inductance dL satisfy the conditions below.

$$\frac{d\omega}{\omega} = -\frac{dC}{C} \qquad \text{Equation (2)}$$
$$\frac{d\omega}{\omega} = -\frac{dL}{L}$$

That is, if a driving angular frequency $\omega$ or a driving frequency f increases, capacitance or inductance decreases. When a target driving frequency $f_t$ is set and the driving frequency f is different from the target driving frequency $f_t$, the variation amount $d\omega$ of a driving angular frequency is dependent on the variation amount dC of capacitance.

If a difference between the target driving frequency $f_t$ and the driving frequency f has a positive value, variation amount of capacitance or inductance of the variable reactive components 132 and 134 may be controlled to have a negative value. If the difference between the target driving frequency $f_t$ and the driving frequency f has a negative value, variation amount of capacitance or inductance of the variable reactive components 132 and 134 may be controlled to have a positive value.

Accordingly, when satisfying the impedance matching conditions, variation amounts $dC_1$ and $dC_2$ of variable capacitances of the variable reactive components 132 and 134 may be given as below to match the driving frequency f with the target driving frequency $f_t$.

$$\begin{pmatrix} dC_1 \\ dC_2 \end{pmatrix} = -\frac{d\omega}{\omega} \begin{pmatrix} C_1 \\ C_2 \end{pmatrix} \qquad \text{Equation (3)}$$

In the equation (3), $C_1$ represents capacitance of a first capacitor, $C_2$ represents capacitance of a second capacitor, and $d\omega$ represents variation amount of an angular frequency.

When a value of $d\omega$ is great, variation amount $dC_1$ of the first capacitance and variation amount $dC_2$ of the second capacitance are significantly changed. In addition, a ratio of the variation amount $dC_1$ of the first capacitance to the variation amount of $dC_2$, i.e., $dC_1/dC_2$ has a constant orientation $C_1/C_2$. The variation amount $dC_1$ of the first capacitance to the variation amount of $dC_2$ are changed to maintain the ratio $dC_1/dC_2$.

Specifically, the value of $d\omega$ may be given as $d\omega=\omega_t-\omega$ (t=0) and variation amount $dC_1$ of the first capacitance may be given as $dC_1=C_1(t=0^+)-C_1(t=0)$ ($\omega_t$ being a target driving angular frequency, $\omega(t=0)$ being a current driving angular frequency, $C_1(t=0)$ being current capacitance, and $C_1(t=0^+)$ being future capacitance).

When the first capacitance $C_1$ and the second capacitance $C_2$ are changed using the equation (3), the impedance matching network and the frequency variable RF power source may not satisfy the impedance matching conditions. Thus, the frequency variable RF power source may change a driving frequency to satisfy the impedance matching conditions.

When the change driving frequency is different from the target driving frequency, the variation amount $dC_1$ of the first capacitance and the variation amount $dC_2$ of the second capacitance are changed again. As a result, the first capacitance and the second capacitance of the impedance matching network continue to be changed until the driving frequency reaches the target driving frequency.

Accordingly, irrespective of a driving frequency variation algorithm of a frequency variable RF generator 110, the impedance matching network 130 may induce the driving frequency of the frequency variable RF power source to reach a target driving frequency. When the frequency variable RF generator 110 may vary a driving frequency to perform impedance matching, the impedance matching network 130 may not operate an impedance matching algorithm and may operate only a frequency restoration algorithm.

On the other hand, assuming that impedance matching is accomplished in the present, the frequency variable RF generator 110 may satisfy impedance matching conditions at a prediction driving angular frequency $\omega_p$. The prediction driving frequency may be given as below.

$$d\omega \simeq -\omega\left(\frac{dC_1}{C_1}+\frac{dC_2}{C_2}\right) \qquad \text{Equation (4)}$$
$$\omega_p = \omega - \omega\left(\frac{dC_1}{C_1}+\frac{dC_2}{C_2}\right)$$

The frequency variable RF generator 110 may receive the prediction driving angular frequency to change a driving frequency to be changed at high speed into the prediction driving angular frequency. However, in the impedance matching network, variation amount of first capacitance of a first variable capacitor and variation amount of second capacitance of a second variable capacitor may have a time delay due to driving speed of a motor. In this case, the driving speed of the motor may be preferably converted into maximum speed. However, in order to match speed, the prediction driving angular frequency may be set to be different from a target driving frequency.

According to a modified embodiment of the present disclosure, the prediction driving angular frequency may be dependent only on a sign of $dC_1$ or $dC_2$ because the $dC_1$ and $dC_2$ have the same sign.

The above-calculated prediction driving frequency fp may be provided to the frequency variable RF generator 110 under the condition where impedance matching is accomplished. Accordingly, the frequency variable RF generator 110 may reach a target driving frequency without a separate impedance matching algorithm. Thus, the driving frequency may easily and rapidly reach the target driving frequency while satisfying the impedance matching condition. As a result, RF power of the target driving frequency may be transferred to a load while satisfying the impedance matching condition.

According to a modified embodiment of the present disclosure, the calculated prediction driving frequency may be provided to the frequency variable RF generator 110 even under the condition where impedance matching is not accomplished.

While the driving frequency is changed, an impedance area of a load capable of accomplishing impedance matching is limited. Accordingly, if impedance matching is not accomplished even by changing a driving frequency, the impedance matching network 130 may include an algorithm that changes the variable reactive components 132 and 134 to search an impedance matching condition. Specifically, a condition of a plasma load may significantly vary depending on time. For example, low power may be required for a first time interval and high power may be required for a second time interval. In this case, impedance matching may be performed by changing a driving frequency for the first time interval while impedance matching cannot be accomplished by changing a driving frequency for the second time interval. Accordingly, there is a need for a variable reactive component which is capable of performing impedance matching under the wide range of load condition.

The impedance matching network may have a impedance matching control algorithm to search an impedance matching condition and a frequency recovery algorithm to induce a driving frequency to reach a target driving frequency. The algorithm to search an impedance matching condition and the algorithm to induce a driving frequency to reach a target driving frequency are expressed by variation amount $dC_1$ of first variable capacitance and variation amount $dC_2$ of second capacitance.

$$\begin{pmatrix} dC_1 \\ dC_2 \end{pmatrix} = \begin{pmatrix} A \\ B \end{pmatrix} - \frac{d\omega}{\omega}\begin{pmatrix} C_1 \\ C_2 \end{pmatrix} \quad \text{Equation (5)}$$

In the equation (5), A and B are arbitrary values. When the values A and B do not satisfy an impedance matching condition, in the variation amounts $dC$ and $dC_2$ of the first and second capacitances, first and second terms of a right-hand side in the equation (5) may compete with each other. The first term is a term set for impedance matching, and the second term is a term for inducing a driving frequency to a target driving frequency. If both the first and second terms operate, a haunting issue may arise.

Accordingly, for efficient operation, the equation (4) may be modified as below.

$$\begin{pmatrix} dC_1 \\ dC_2 \end{pmatrix} = g_1\begin{pmatrix} A \\ B \end{pmatrix} - g_2\frac{d\omega}{\omega}\begin{pmatrix} C_1 \\ C_2 \end{pmatrix} \quad \text{Equation (6)}$$

In the equation (6), $g_1$ represents a first weighting function and $g_2$ represents a second weighting function. The first weighting function $g_1$ has a large value when a reflection coefficient is great and has a small value when the reflection coefficient is small. The second weighting function $g_2$ has a small value when the reflection coefficient is large and has a large value when the reflection coefficient is small.

Referring to the equation (6), when a reflection coefficient is so great so to be far from the impedance matching condition, impedance matching is performed by mainly operating a first term of the right-hand side. The variation amount $dC_1$ of the first variable capacitance and the variation amount $dC_1$ of the second variable capacitance may be changed while keeping orientation (A/B). More specifically, the first variable capacitance and the second variable capacitance may be changed while a ratio of A to B (A/B) keeps constant.

On the other hand, referring to the equation (6), when the reflection coefficient is so small as to nearly reach the impedance matching condition, the impedance matching network induces a driving frequency of the frequency variable RF power source 110 to converge on a target driving frequency by mainly operating a second term of the right-hand side. The variation amount $dC_1$ of the first variable capacitance and the variation amount $dC_1$ of the second variable capacitance may be changed while keeping orientation ($C_1/C_2$).

According to an embodiment of the present disclosure, the impedance matching network 130 mainly operates a driving frequency recovery algorithm when the frequency variable RF power source 110 changes a driving frequency to perform impedance matching. Therefore, the frequency variable RF power source 110 may perform high-speed impedance matching and the impedance matching network 130 may induce the frequency variable RF power source 110 to change a driving frequency into a target driving frequency while keeping the impedance matching. Thus, when a load is a plasma load, stability of hardware may be ensured by the high-speed impedance matching. In addition, the driving frequency may converge on the target driving frequency to achieve process reproducibility.

An impedance matching method according to an embodiment of the present disclosure may be applied to continuous wave (CW) plasma or pulse plasma.

According to an embodiment of the present disclosure, when impedance matching cannot be performed only by the frequency variable RF power source 110, the impedance matching network 130 mainly operates an impedance matching control algorithm. The impedance matching network 130 performs impedance matching by changing reactance of a variable reactive component. Therefore, when the impedance matching is performed, the impedance matching network 130 mainly operates a driving frequency recovery algorithm. Thus, the impedance matching network 130 may induce a driving frequency of the frequency variable RF power source 110 to change into a target driving frequency while keeping an impedance matching condition.

According to a modified embodiment of the present disclosure, the frequency variable RF power source 110 may provide a driving frequency to the impedance matching network. In addition, the frequency variable RF power source 110 may transfer measured electrical characteristics to the impedance matching network. As a result, the impedance matching network may allow a separate step of measuring a driving frequency and a separate step of measuring electrical characteristics to be omitted.

Frequency Variable Impedance Matching

Hereinafter, a frequency variable impedance matching method according to an embodiment of the present disclosure will now be described.

The frequency variable RF power source 110 may measure electrical characteristics at output terminals N1 and N2 to calculate output impedance $Z_T$, a reflection coefficient S11 or reflective wave power. The frequency variable RF power source 110 may vary a driving frequency within the range of a minimum frequency and a maximum frequency. Conventionally, the variable range may be 5 percent of a reference frequency or a mean frequency. Coarse frequency scan may be performed at regular intervals to find a driving frequency having a smallest reflection coefficient within the range of the minimum frequency and the maximum frequency. Thus, a period of the smallest reflection coefficient may be found. Fine frequency scan may be performed in the found frequency region. Thus, a driving frequency of the smallest reflection coefficient may be selected.

Figure 6:
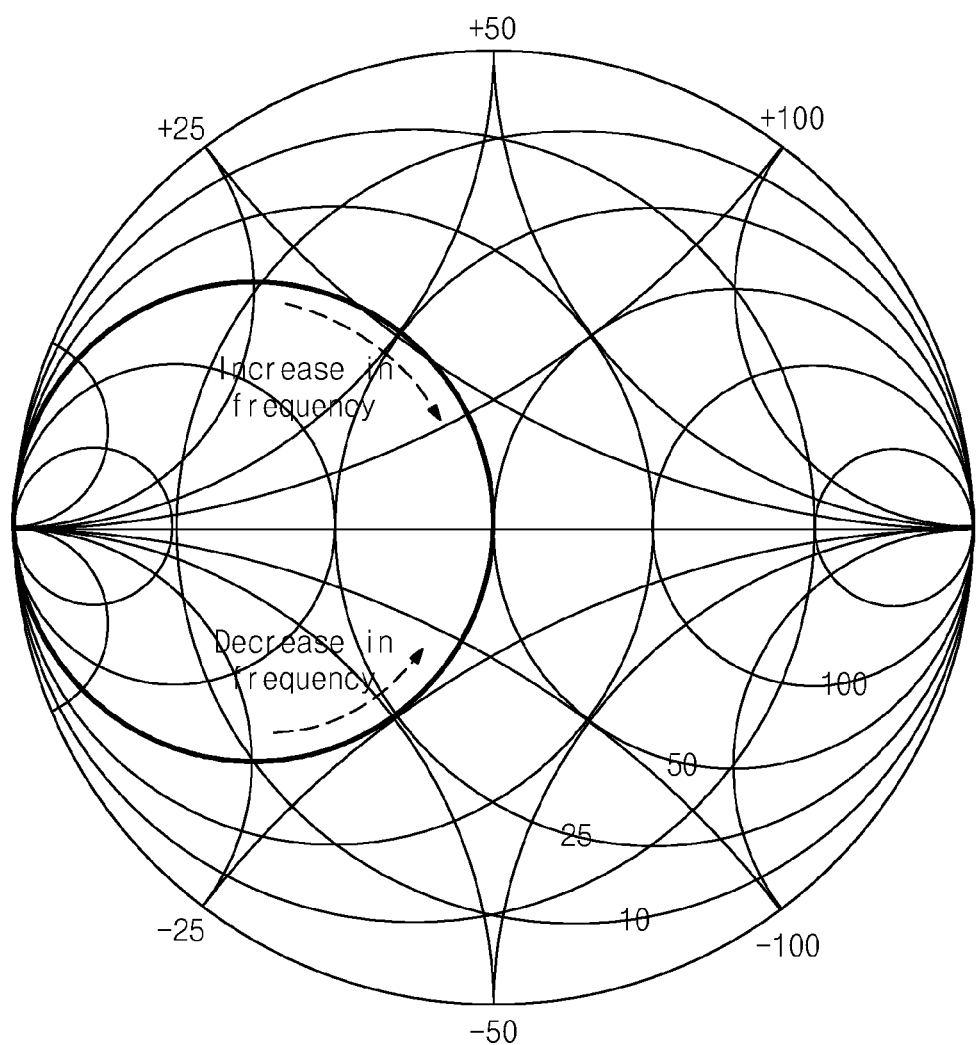
FIG. 6 is a Smith chart illustrating frequency variable impedance matching according to an embodiment of the present disclosure.

FIG. 6 is a Smith chart illustrating frequency variable impedance matching according to an embodiment of the present disclosure.

Referring to FIGS. 5 and 6, if a driving frequency is changed when a load is fixed, a reflection coefficient may follow a constant conductance circle on the Smith chart. Accordingly, when an imaginary part of the reflection coefficient has a positive value, the driving frequency increases. When the imaginary part of the reflection coefficient has a negative value, the driving frequency decreases. Thus, the driving frequency may stop at a point where the reflection coefficient is minimal or a point where the reflection coefficient is zero. A frequency variable RF power source may perform frequency variable impedance matching.

The frequency variable RF power source may perform impedance matching by measuring electrical characteristics at an output of a variable RF power source and varying a driving frequency using the measured electrical characteristics (S118). The frequency variable RF power source may measure electrical characteristics of an output terminal (S112). A reflection coefficient S11 and impedance $Z_T$ may be calculated using the driving frequency and the measured electrical characteristics (S114). A matching state is tested using the reflection coefficient S11 or a voltage standing wave ratio (VSWR) (S118a). When the reflection coefficient S11 is equal to or greater than a tolerance, the driving frequency may be changed for impedance matching (S118c). When the driving frequency reaches a maximum or a minimum, the driving frequency may be maintained at the maximum or the minimum (S118b). As the driving frequency is changed, the impedance $Z_T$ of a direction viewing a load may be changed.

Hereinafter, a variable reactance impedance matching method according to an embodiment of the present disclosure will now be described.

According to the present disclosure, a variable reactive component may be one of a variable capacitor to provide variable capacitance and a variable inductor to provide variable inductance.

Various Types of Matching Systems

Impedance matching networks may be classified into various types of impedance matching networks according to fashions of variable reactive components or passive components to a transmission line. If impedance matching networks each include first and second capacitors, they may be classified into L-type, inverted L-type, T-type, and π-type impedance matching networks according to fashions of connecting the first and second capacitors to a transmission line 120.

Impedance matching of an impedance matching network may include extracting a characteristic vector (S232a), transforming a device vector indicating reactance of a variable reactive component into an analysis vector using a predetermined transformation matrix and expressing the characteristic vector on an analysis coordinate system using the analysis vector as a coordinate axis (S232b), analyzing the characteristic vector on the analysis coordinate system to extract a displacement vector for impedance matching (S232c), transforming the displacement vector into a reduced device vector using the transformation matrix (S232d), and extracting variation amount of capacitance or inductance using the reduced device vector (S232e).

Selection of Characteristic Vector

According to an embodiment of the present disclosure, the characteristic vector may be defined based on electrical characteristics measured at an input terminal of the impedance matching network or an output terminal of the frequency variable RF power source and may be physical quantity having a standardized size.

According to an embodiment of the present disclosure, the characteristic vector may be defined from a reflection coefficient S11 of the transmission line. The coefficient S11 ($=\Gamma$) of the transmission line is defined by characteristic impedance of the transmission line $Z_0$ and impedance Z of a direction viewing a load.

$$S_{11} = \Gamma = \frac{Z - Z_0}{Z + Z_0} \qquad \text{Equation (7)}$$

A size of the reflection coefficient S11 (i.e., S=|S11|) may be any value between 0 and 1. The impedance Z of the transmission line indicates impedance of a system including an impedance matching network and the load. A phase of the reflection coefficient S11 varies depending on a position of the transmission line. Thus, the reflection coefficient S11 may be mutually converted depending on a position of the transmission line.

The impedance matching network may include at least two variable reactive components. In this case, the characteristic vector may be physical quantity including at least two components to explicitly decide reactance of each of the reactive components. For example, a characteristic vector Q may be defined as a two-dimensional vector having an real part Re{S11} and an imaginary part Im{S11} of the reflection coefficient as elements.

$$Q = \begin{pmatrix} Q_1 \\ Q_2 \end{pmatrix} = \begin{pmatrix} \text{Re}(S_{11}) \\ \text{Im}(S_{11}) \end{pmatrix} \qquad \text{Equation (8)}$$

Selection of Analysis Coordinate System

An analysis coordinate system is selected to express a predetermined phase space that quantitatively relates electrical characteristics C1 and C2 of the impedance matching network with electrical characteristics Z or S11 of the transmission line. For achieving this, a coordinate of the analysis coordinate system is selected from physical quantities associated with electrical characteristics of the impedance matching network, and electrical characteristics of the transmission line are expressed as a single point on the selected analysis coordinate system.

According to an embodiment of the present disclosure, a coordinate of the analysis coordinate system (hereinafter referred to as "analysis coordinate") may be expressed as a function of electrical characteristics (e.g., reactance) of variable reactive components constituting the impedance matching network, and the characteristic vector expressing measured electrical characteristics of the transmission line may be expressed as one point on the analysis coordinate.

Preferably, the analysis coordinate selects a relationship between the electrical characteristics of the matching system and the electrical characteristics of the transmission line to be injectively mapped. The term "injective mapping" means a relationship where a single matching point corresponds to a single coordinate.

The analysis coordinate G may be physical quantities obtained by transforming measurable electrical characteristics (e.g., reactance) of the impedance matching network using a predetermined transformation matrix T. For example, the analysis coordinate G may be obtained through an inner product of the predetermined transmission matrix T and a predetermined device vector X, as expressed below.

$$G = TX \qquad \text{Equation (9)}$$

The device vector X may have physical quantities associated with electrical characteristics of the respective variable reactive components constituting the impedance matching network as elements and may be selected according to type of the impedance matching network and the physical quantity of the device vector X. As a result, the analysis coordinate G is also selected according to type of the matching system.

More specifically, the impedance matching network may include two variable reactive components. In this case, the analysis coordinates G1 and G2 may be obtained through physical quantities X1 and X2 associated with electrical characteristics of the respective coordinate reactive components and an inner product of a predetermined secondary square matrix. According to the present disclosure, elements of the transformation matrix T (i.e., a11, a12, a21, and a22) may be selected from values between −1 and 1.

The transformation matrix T may be prepared through various methods. For example, the transformation matrix T may be obtained by at least one of analysis through theoretical approach, simulation analysis using a computer, and analysis of an impedance measurement value of the impedance matching network according to a variable reactive component value and empirical data on a matching procedure. Such an analysis is done based on the type of the matching system and the physical quantity of the device vector X. In addition, a form and a rank of the transformation matrix T are decided by the number of variable reactive components constituting the matching system. That is, if the matching system includes more number of variable reactive components, the form and the rank of the transformation matrix T may increase.

As described above, the impedance matching network may include two variable capacitors. In this case, the transformation matrix T and the device vector T may be expressed as a function of capacitance of the variable capacitors.

When the impedance matching network is L-type or π-type, the device vector X may be given as below.

$$X_i = -\frac{1}{\omega C_i} \qquad \text{Equation (10)}$$

In the equation (10), ω represents an angular frequency and Ci represents capacitance of respective variable capacitors.

When the impedance matching network is inverted L-type or T-type, the device vector X may be given as below.

$$X_i = \omega C_i \qquad \text{Equation (11)}$$

Decision of Displacement Vector

A displacement vector analyzes a size or position of a characteristic vector corresponding to a measured state of the transmission line (hereinafter referred to as "measured characteristic vector") on the analysis coordinate system to express a size of coordinate movement required for moving to an impedance matching line.

When the impedance matching network is L-type or π-type, displacement vectors dG1 and dG2 may be expressed as below.

$$\begin{pmatrix} dG_1 \\ dG_2 \end{pmatrix} = \begin{pmatrix} -Q_2 \\ Q_1 \end{pmatrix} = \begin{pmatrix} -\text{Im}(S_{11}) \\ \text{Re}(S_{11}) \end{pmatrix} \qquad \text{Equation (12)}$$

When the impedance matching network is inverted L-type or T-type, displacement vectors dG1 and dG2 may be expressed as below.

$$\begin{pmatrix} dG_1 \\ dG_2 \end{pmatrix} = \begin{pmatrix} -Q_2 \\ Q_1 \end{pmatrix} = \begin{pmatrix} -\text{Im}(S_{11}) \\ -\text{Re}(S_{11}) \end{pmatrix} \qquad \text{Equation (13)}$$

According to an embodiment of the present disclosure, the displacement vector dG is physical amount obtained by transforming a reflection coefficient or impedance to analyze impedance matching on the analysis coordinate system. Thus, there is a need for the step of transforming the displacement vector into a size of electrical characteristics of components constituting the impedance matching network or physical amount associated with the size so as to control the impedance matching network.

For achieving this, there is a need for the step of inversely transforming the displacement vector dG into a reduced device vector dX' having a dimension of variable physical amount of the variable reactive component. In addition, there is a need for the step of transforming the reduced device vector dX' into a driving vector V controlling the variable reactive components.

Considering the fact that the analysis coordinate systems G1 and G2 are obtained by a transformation matrix T, when the impedance matching network is L-type or π-type (variable capacitor), the reduced device vector dX' may be obtained through an inverse matrix $T^{-1}$ of the transformation matrix and an inner product of the displacement vector dG.

$$\begin{pmatrix} dX_1 \\ dX_2 \end{pmatrix} = T^{-1} \begin{pmatrix} dG_1 \\ dG_2 \end{pmatrix} \qquad \text{Equation (14)}$$

$$-\begin{pmatrix} \dfrac{dC_1}{\omega C_1^2} \\ \dfrac{dC_2}{\omega C_2^2} \end{pmatrix} = T^{-1} \begin{pmatrix} -\text{Im}(S_{11}) \\ \text{Re}(S_{11}) \end{pmatrix}$$

When the impedance matching network is inverted L-type or T-type (variable capacitor), the reduced device vector dX' may be obtained through an inverse matrix $T^{-1}$ of the transformation matrix and an inner product of the displacement vector dG.

$$\begin{pmatrix} dX_1 \\ dX_2 \end{pmatrix} = T^{-1} \begin{pmatrix} dG_1 \\ dG_2 \end{pmatrix}$$

$$\omega \begin{pmatrix} dC_1 \\ dC_2 \end{pmatrix} = T^{-1} \begin{pmatrix} -\text{Im}(S_{11}) \\ -\text{Re}(S_{11}) \end{pmatrix}$$

Equation (15)

According to an embodiment of the present disclosure, reactance of the variable reactive component may be changed by controlling rotation of a predetermined driving motor, rectilinear motion of rectilinear motion means or a switching element for switching a fixed capacitor connected in parallel.

For example, when the variable reactive component is a variable capacitor, variation amounts $dC_1$ and $dC_2$ of capacitance of the L-type or π-type impedance matching network may be expressed as below.

$$\begin{pmatrix} dC_1 \\ dC_2 \end{pmatrix} = - \begin{pmatrix} \frac{1}{\omega C_1^2} & 0 \\ 0 & \frac{1}{\omega C_2^2} \end{pmatrix}^{-1} T^{-1} \begin{pmatrix} -\text{Im}(S_{11}) \\ \text{Re}(S_{11}) \end{pmatrix}$$

Equation (16)

For example, when the variable reactive component is a variable capacitor, variation amounts $dC_1$ and $dC_2$ of capacitance of the L-type or π-type impedance matching network may be expressed as below.

$$\begin{pmatrix} dC_1 \\ dC_2 \end{pmatrix} = \frac{1}{\omega} T^{-1} \begin{pmatrix} -\text{Im}(S_{11}) \\ -\text{Re}(S_{11}) \end{pmatrix}$$

Equation (17)

Combination of Frequency Recovery Algorithm and Variable Reactance Impedance Matching Algorithm Considering frequency recovery impedance matching, when the variable reactive component is a variable capacitor, variation amounts $dC_1$ and $dC_2$ of capacitance of the L-type or π-type impedance matching network may be expressed as below.

$$\begin{pmatrix} dC_1 \\ dC_2 \end{pmatrix} =$$

Equation (18)

$$-g_1 \begin{pmatrix} \frac{1}{\omega C_1^2} & 0 \\ 0 & \frac{1}{\omega C_2^2} \end{pmatrix}^{-1} T^{-1} \begin{pmatrix} -\text{Im}(S_{11}) \\ \text{Re}(S_{11}) \end{pmatrix} - g_2 \frac{d\omega}{\omega} \begin{pmatrix} C_1 \\ C_2 \end{pmatrix}$$

In the equation (18), a first term of a right-hand side is variation amount of capacitance for reactance impedance matching, and a second term of the right-hand side is variation amount of capacitance for inducing a driving frequency to a target driving frequency. In the equation (18), $g_1$ represents a first weighting function and $g_2$ represents a second weighting function. The first weighting function $g_1$ has a large value when a reflection coefficient is large and has a small value when the reflection coefficient is small. On the other hand, the second weighting function $g_2$ has a small value when a reflection coefficient is large and has a large value when the reflection coefficient is small.

When the reflection coefficient is large, the first term of the right-hand side may mainly operate to perform impedance matching at low speed. On the other hand, when the reflection coefficient is small, the second term of the right-hand side may mainly operate to induce a driving frequency to a target driving frequency at relatively high speed.

According to a modified embodiment of the present disclosure, in the first term of the right-hand side, a driving angular frequency, $C_1$, and $C_2$ may be processed as constants to improve calculation speed. In the second term of the right-hand side, a driving angular frequency, $C_1$, and $C_2$ may be processed as constants to improve calculation speed.

Considering frequency recovery impedance matching, when the variable reactive component is a variable capacitor, variation amounts $dC_1$ and $dC_2$ of capacitance of the inverted L-type or T-type impedance matching network may be expressed as below.

$$\begin{pmatrix} dC_1 \\ dC_2 \end{pmatrix} = g_1 \frac{1}{\omega} T^{-1} \begin{pmatrix} -\text{Im}(S_{11}) \\ -\text{Re}(S_{11}) \end{pmatrix} - g_2 \frac{d\omega}{\omega} \begin{pmatrix} C_1 \\ C_2 \end{pmatrix}$$

Equation (19)

In the equation (19), a first term of a right-hand side is variation amount of capacitance for reactance impedance matching, and a second term of the right-hand side is variation amount of capacitance for inducing a driving frequency to a target driving frequency. In the equation (19), $g_1$ represents a first weighting function and $g_2$ represents a second weighting function. The first weighting function $g_1$ has a large value when a reflection coefficient is large and has a small value when the reflection coefficient is small. On the other hand, the second weighting function $g_2$ has a small value when a reflection coefficient is large and has a large value when the reflection coefficient is small.

When the reflection coefficient is large, the first term of the right-hand side may mainly operate to perform impedance matching at low speed. On the other hand, when the reflection coefficient is small, the second term of the right-hand side may mainly operate to induce a driving frequency to a target driving frequency at relatively high speed.

According to a modified embodiment of the present disclosure, in the first term of the right-hand side, a driving angular frequency, $C_1$, and $C_2$ may be processed as constants to improve calculation speed. In the second term of the right-hand side, a driving angular frequency, $C_1$, and $C_2$ may be processed as constants to improve calculation speed.

Driving Vector

A driving vector V may include values for numerical control of a driving motor as elements, and its magnitude and physical dimension may vary depending on a method of the numerical control and kind of the driving motor. For example, the driving vector V may be given as a scalar product of variation amounts dC1 and dC2 of capacitance and a predetermined numerical control factor M.

$$\begin{pmatrix} V_1 \\ V_2 \end{pmatrix} = M \begin{pmatrix} dC_1 \\ dC_2 \end{pmatrix}$$

Equation (20)

In the equation (20), $V_1$ and $V_2$ represent control parameters input to drive driving motors connected to the first and second variable capacitors, respectively. In addition, the numerical control factor M may be standard magnitude of the numeral control (e.g., standard speed of a driving motor), and the variation amounts $dC_1$ and $dC_2$ of the capacitance is selected to having the same dimension as the driving vector V.

According to a modified embodiment of the present disclosure, $V_1$ and $V_2$ may be a control parameter for linear motion of a linear motion mechanism or a control parameter of a switching component for switching a fixed capacitor connected in parallel.

Figure 7:
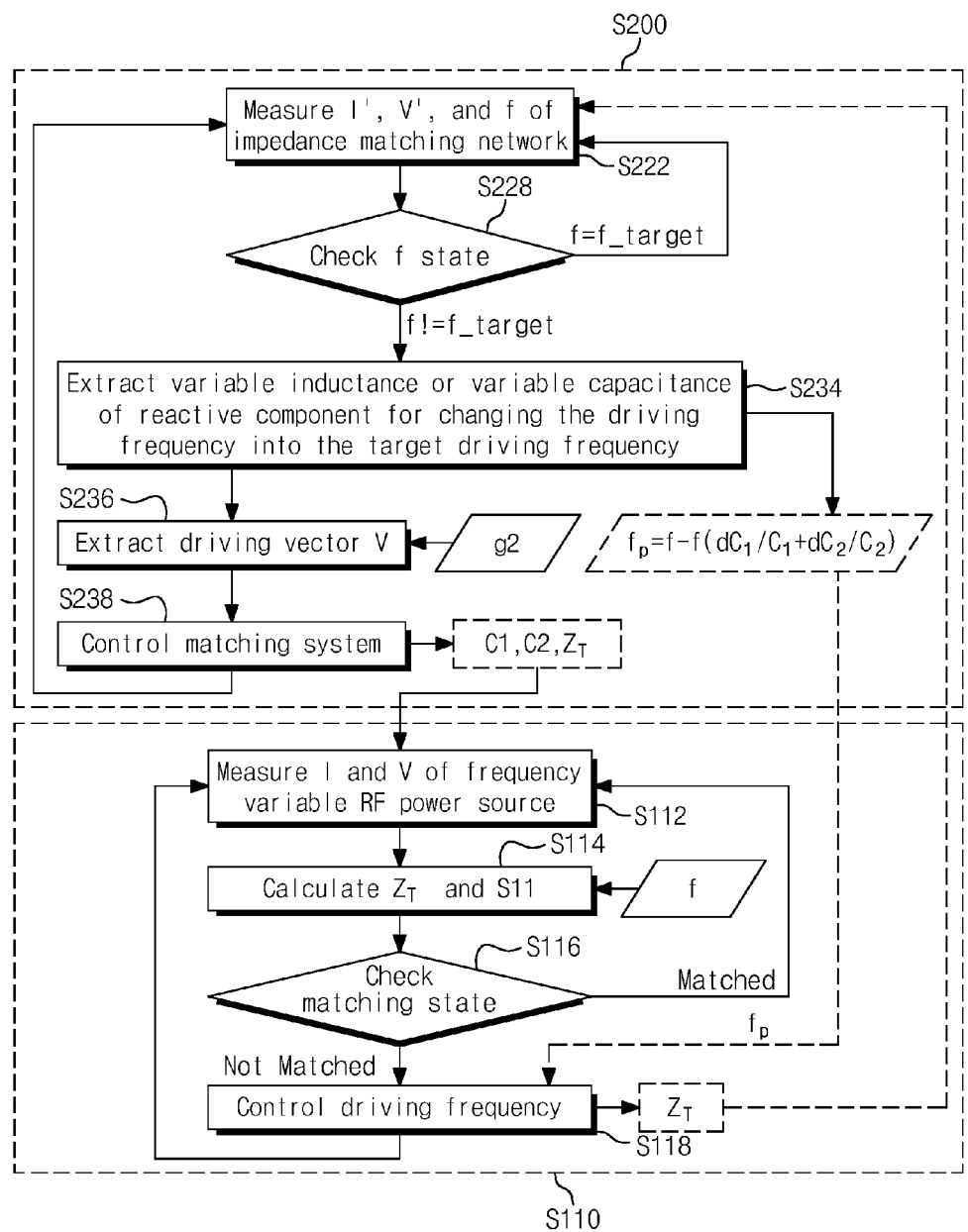
FIG. 7 is a flowchart summarizing an impedance matching method according to another embodiment of the present disclosure.

FIG. 7 is a flowchart summarizing an impedance matching method according to another embodiment of the present disclosure.

Referring to FIG. 7, a variable reactance impedance matching network is disposed between a frequency variable RF power source to vary a driving frequency f and a load. In an impedance matching method of the variable reactance impedance matching network, a frequency variable RF power source is induced to operate at a target driving frequency by changing capacitance or inductance of a variable reactive component of the impedance matching network (S200). Variation amount of the capacitance or inductance of the variable reactive component of the impedance matching network is controlled as a function of a difference between a target driving frequency $f_t$ and the driving frequency f.

The impedance matching method includes performing first impedance matching by measuring electrical characteristics at an output of a frequency variable RF power source and varying a driving frequency using the measured electrical characteristics (S110) and disposing an impedance matching network including a variable reactive component between the frequency variable RF power source and a load to changing capacitance or inductance of the variable reactive components (S200). Variation amount of the capacitance or the inductance of the variable reactive component is given as a function of a difference between a target driving frequency $f_t$ and the driving frequency f.

The step of performing the first impedance matching (S110) includes measuring a first electrical characteristic at an output of a frequency variable RF power source (S112), checking an impedance matching state using the first electrical characteristic at the frequency variable RF power source (S114 and S116), and changing a driving frequency of the frequency variable RF power source (S118).

The step of changing capacitance or inductance of the variable reactive component (S200) includes measuring electrical characteristics of an impedance matching network (S222), checking whether the driving frequency is a target driving frequency (S228), calculating variation amount of inductance or capacitance of a variable reactive component for changing the driving frequency when the driving frequency does not match the target driving frequency (S234), and controlling the variable reactive component using the variation amount (S236 and S238).

Figure 8:
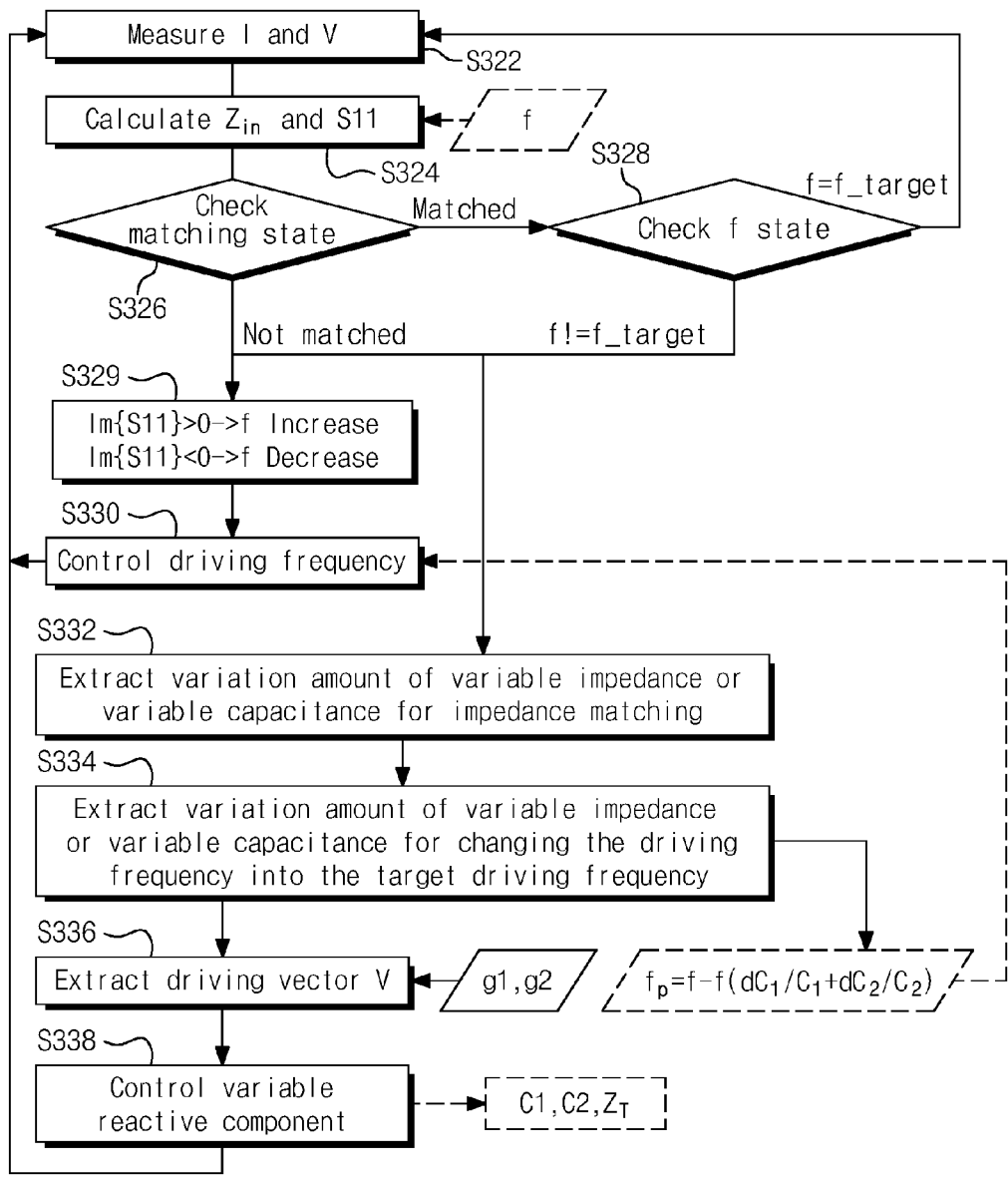
FIG. 8 is a flowchart summarizing an impedance matching method according to another embodiment of the present disclosure.

FIG. 8 is a flowchart summarizing an impedance matching method according to another embodiment of the present disclosure.

Referring to FIG. 8, an impedance matching network and a frequency variable RF power source operation in one body as a RF power system. Accordingly, only electrical characteristics at an output terminal of the frequency variable RF power source may be measured (S322). Thus, impedance Zin or a reflection coefficient S11 in a direction viewing a load at the variable reactive component may be calculated through calculation (S324). When impedance matching conditions are satisfied, the RF power system is checking whether a driving frequency is a target driving frequency (S326 and S328). When the impedance matching conditions are not satisfied, the driving frequency is varied (S329 and S330). In addition, when the impedance matching conditions are not satisfied, first variation amount of variable inductance or variable capacitance of a reactive component for impedance matching is extracted (S332). In addition, when the driving frequency is different from the target driving frequency, second variation amount of variable inductance or variable capacitance of a reactive component for changing the driving frequency is extracted (S334). Thereafter, a driving vector is calculated by multiplying a first weighting function by the first variation amount and multiplying a second weighting function by the second variation amount (S336). The driving vector drives the variable inductance or variable capacitance (S338).

Figure 9:
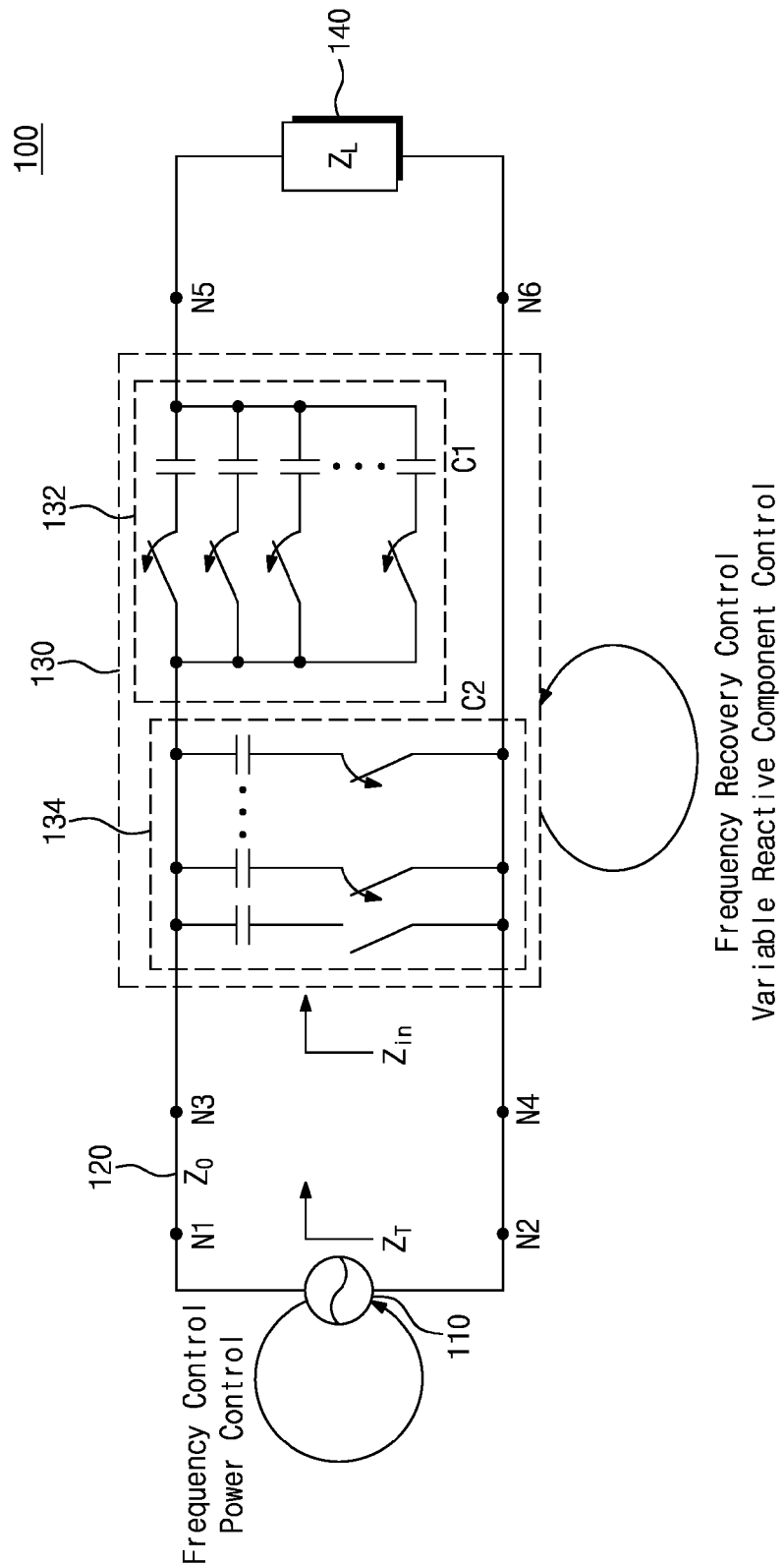
FIGS. 9 and 10 illustrate RF power systems according to other embodiments of the present disclosure, respectively.

FIG. 9 illustrates an RF power system according to another embodiment of the present disclosure.

Referring to FIG. 9, a variable reactive component may include a fixed capacitor connected in parallel. The fixed capacitor may include a switch to change capacitance. Thus, since variable capacitance does not use a motor, impedance matching speed and target driving frequency recovery speed may be improved.

Figure 10:
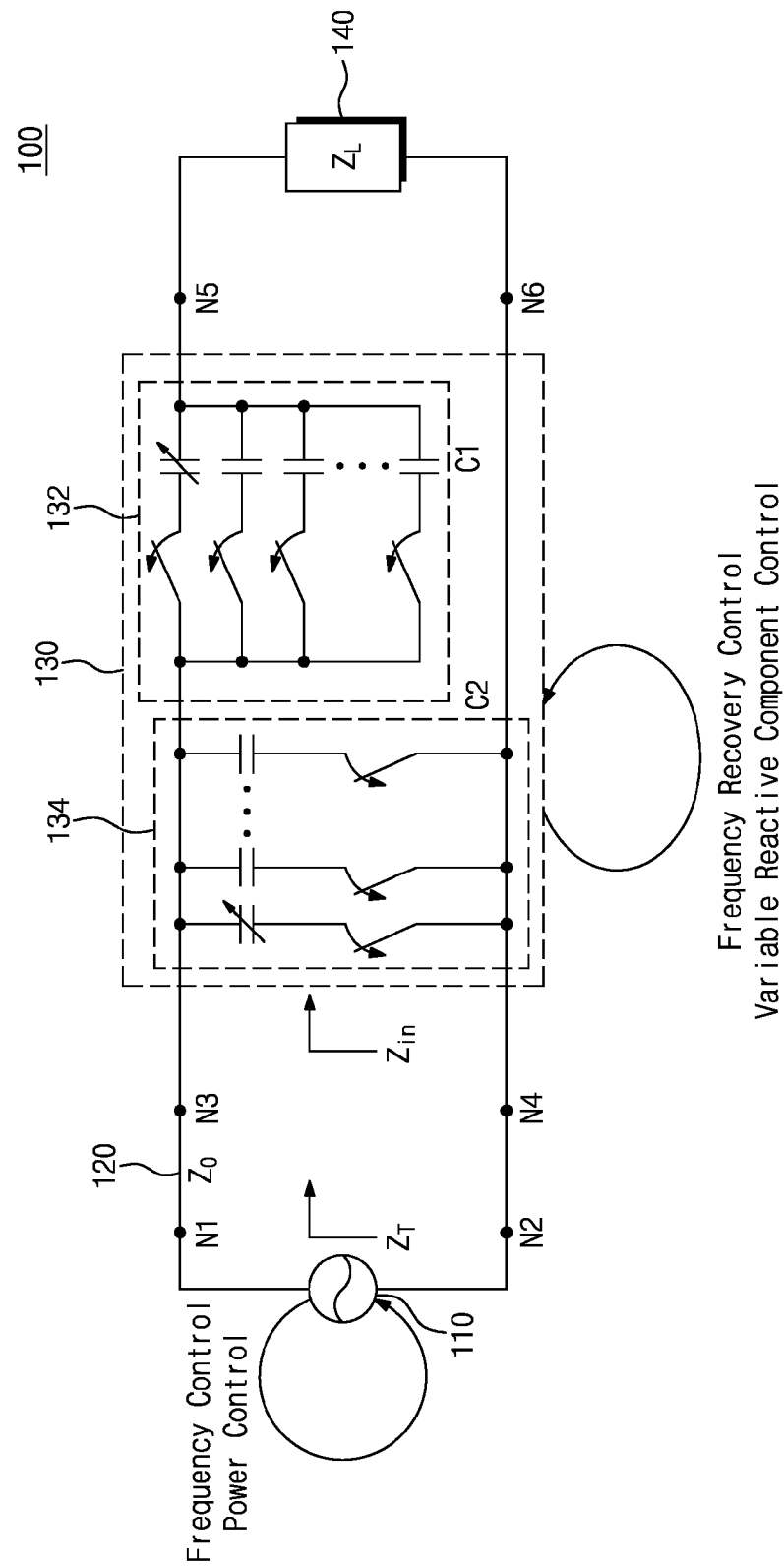

FIG. 10 illustrates an RF power system according to another embodiment of the present disclosure.

Referring to FIG. 10, a variable reactive component may include a fixed capacitor and a variable capacitor connected in parallel. The fixed capacitor may include a switch to change capacitance. Thus, variable capacitance may rapidly approach a proximate target value and the variable capacitor using a driving motor may perform minute impedance matching or frequency recovery.

Figure 11:
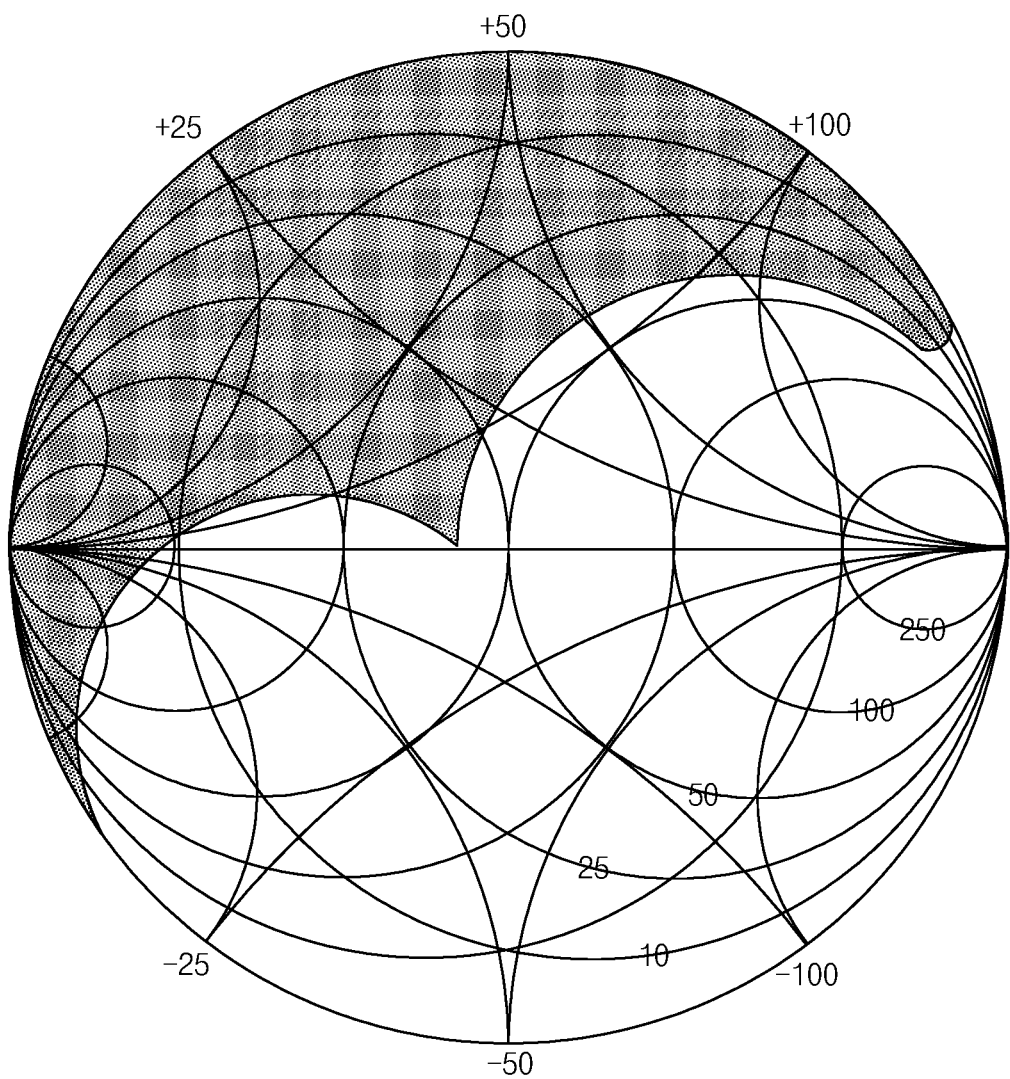
FIG. 11 is a Smith chart showing an impedance matching region in a standard L-type impedance matching network.

FIG. 11 is a Smith chart showing an impedance matching region in a standard L-type impedance matching network.

Referring to FIGS. 1 and 11, a first fixed inductor L1 is 100 nH, a second fixed inductor L2 is 500 nH, a variable range of the first variable capacitor 132 is between 150 pF and 1000 pF, and a variable range of the second variable capacitor 134 is between 85 pF and 500 pF. An impedance matchable area is expressed through a first variable capacitor and a second variable capacitor as a shadow region in FIG. 11.

Figure 12:
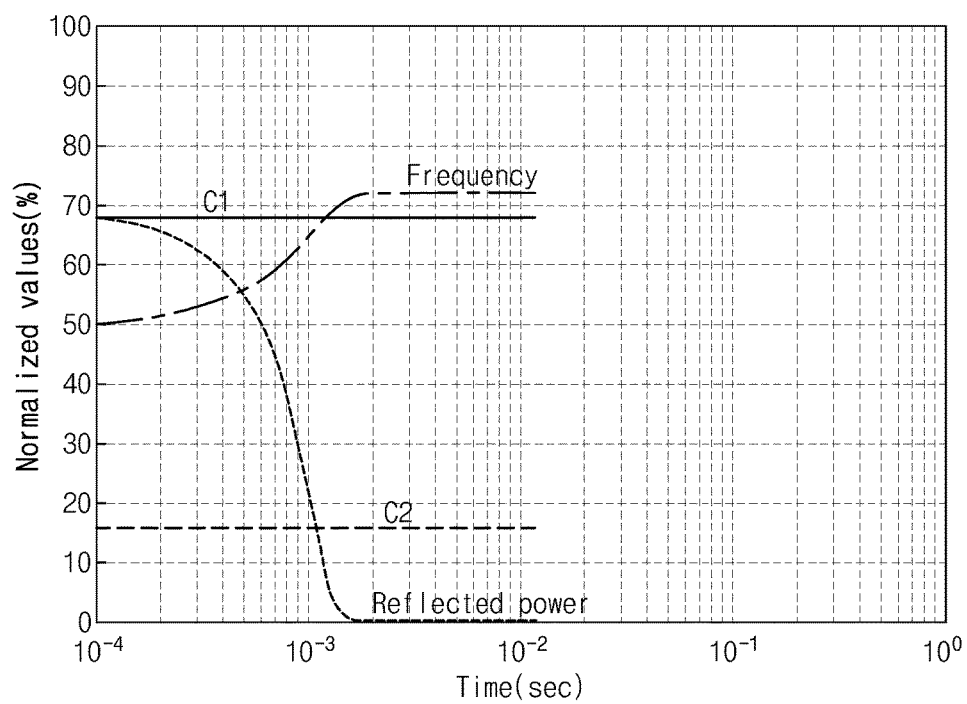
FIG. 12 is a graph showing conditions of impedance matching using only a frequency variable RF power source when impedance matching is possible only with the frequency variable RF power source.

FIG. 12 is a graph showing conditions of impedance matching using only a frequency variable RF power source when impedance matching is possible only with the frequency variable RF power source.

Referring to FIG. 1 and FIG. 12, conditions used in the simulation was as follows. A first fixed inductor was 100 nH, a second fixed inductor was 500 nH, a variable range of a first variable capacitor was between 150 pF and 1000 pF, and a variable range of a second variable capacitor was between 85 pF and 500 pF. For variable frequency impedance matching, the first variable capacitor was used to be fixed to 724.5 pF, and the second variable capacitor was used to be fixed to 150 pF. A time interval of a control loop of the variable frequency RF power source is 100 microseconds (μsec). A frequency variation algorithm increases a driving frequency when an imaginary part of a reflection coefficient has a positive value and decreases the driving frequency when the imaginary part of the reflection coefficient has a negative value.

According to a result of the simulation, frequency impedance matching was performed at about 2 msec. In this case, the y-axis of the driving frequency is given as $50+(f-f_o)/(2\Delta f)$. Thus, 2 Δf is a frequency variable area, $f_o$ is a center driving frequency.

The driving frequency increased by 70 percent after about 2 msec at an initial value (50 percent). An algorithm to vary the driving frequency may perform impedance matching at high speed of about 2 msec. However, the driving frequency increased from 50 percent to 70 percent. Under the situation where impedance of a plasma load varies depending on time, the driving frequency f cannot be constantly maintained. Thus, plasma process stability and reproducibility may be deteriorated.

On the other hand, when the time interval of the control loop is less than 100 μsec, the algorithm to vary the driving frequency may perform impedance matching at 2 msec or less.

Figure 13:
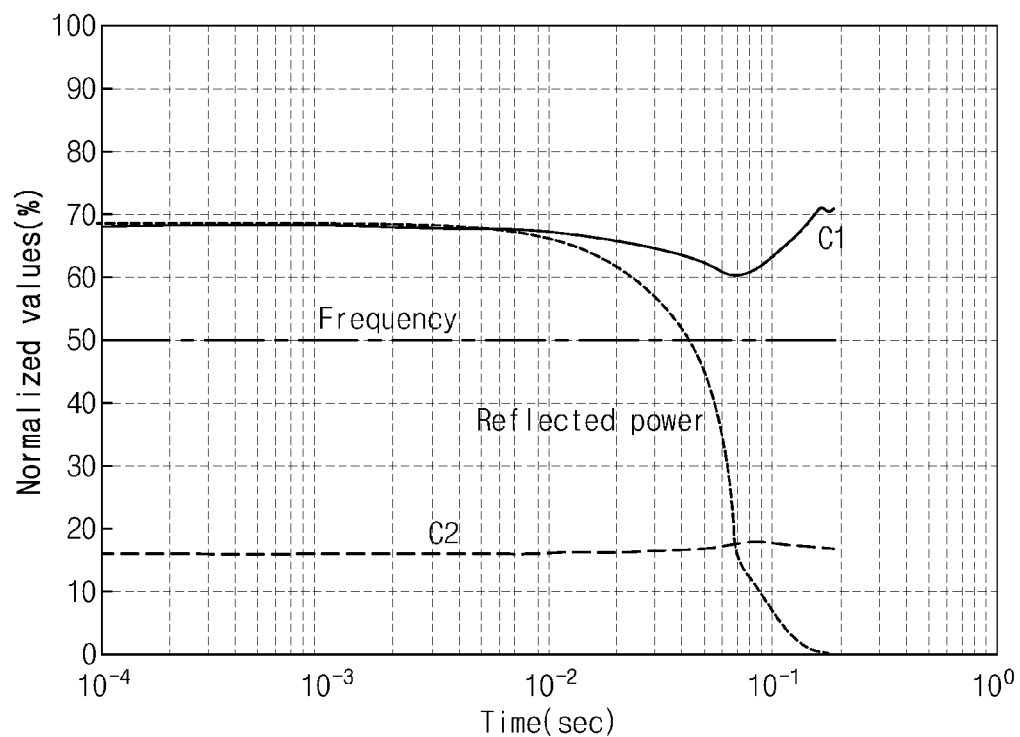
FIGS. 13 through 17 are graphs of simulation results showing traces of impedance matching according to embodiments of the inventive concept, respectively.

FIG. 13 is a graph showing conditions of impedance matching only using a variable reactive component at a fixed driving frequency when the impedance matching is possible only with a frequency variable RF power source.

Referring to FIG. 13, conditions used in the simulation was as follows. A first fixed inductor was 100 nH, a second fixed inductor was 500 nH, a variable range of a first variable capacitor was between 150 pF and 1000 pF, and a variable range of a second variable capacitor was between 85 pF and 500 pF. An initial condition of the first variable capacitor was 724.5 pF, and an initial condition of the second variable capacitor was 150 pF. The equation (16) was used for impedance matching.

For matching of a variable reactive component, a driving frequency was used to be fixed to 50 percent (fo). A time interval of a control loop was 100 μsec.

Due to time required for driving a motor of a variable capacitor, a reactance variation algorithm of the variable reactive component requires about 200 milliseconds (msec) for impedance matching. Thus, time required for reducing reflected power to 50 percent is about 40 msec.

Under the situation where impedance of a plasma load varies depending on time, time required for reducing reflected power to 50 percent is about 40 msec. Thus, plasma process stability and reproducibility may be deteriorated.

Figure 14:
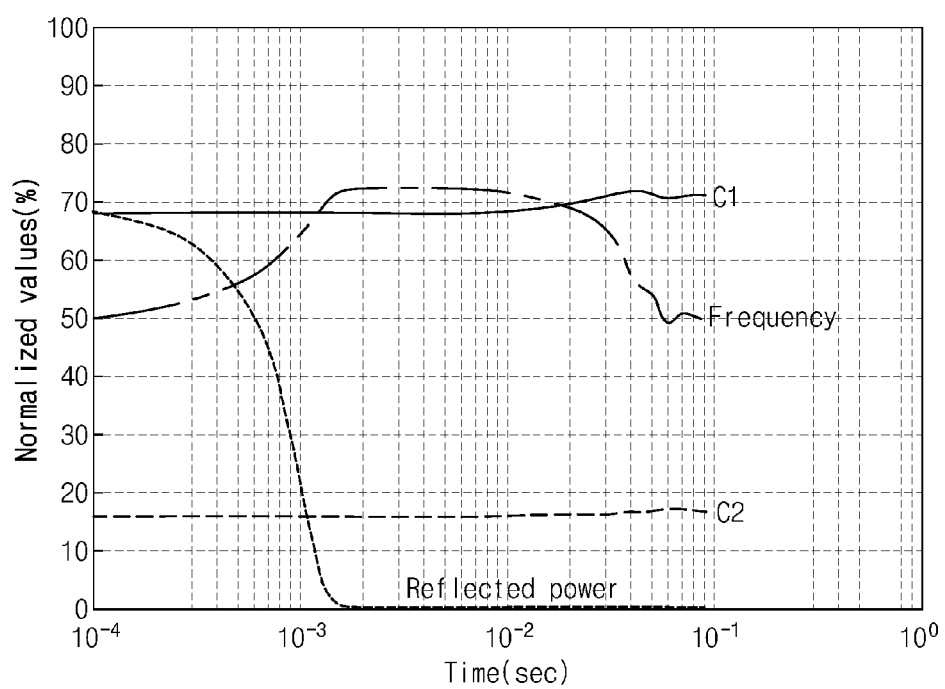

FIG. 14 is a graph showing conditions of impedance matching adopting an algorithm to recover a driving frequency to a target driving frequency by simultaneously using a frequency variable RF power source and a variable reactive component when the impedance matching is possible only with a frequency variable RF power source.

Referring to FIG. 14, conditions used in the simulation was as follows. A first fixed inductor was 100 nH, a second fixed inductor was 500 nH, a variable range of a first variable capacitor was between 150 pF and 1000 pF, and a variable range of a second variable capacitor was between 85 pF and 500 pF. An initial condition of the first variable capacitor was 724.5 pF, and an initial condition of the second variable capacitor was 150 pF. An initial condition of a driving frequency is 50 percent. A time interval of a control loop is 100 μsec. A frequency variation algorithm of the frequency variable RF power source increases the driving frequency when an imaginary part of a reflection coefficient has a positive value and decreases the driving frequency when the imaginary part of the reflection coefficient has a negative value. The Equation (18) was used for impedance matching and frequency recovery of a variable reactance impedance matching network.

The impedance matching was accomplished at about 2 msec through variation of the driving frequency. The driving frequency converges into a target driving frequency (50 percent) at about 10 msec while satisfying the impedance matching conditions. Thus, impedance matching time is very fast (about 2 msec), and time taken for the driving frequency to reach the target driving frequency is about 100 msec which is shorter than impedance matching time using a variable reactive component in FIG. 13.

Time when reflected power drops below 50 percent is about 0.6 msec. Thus, process instability caused by the reflection power is improved. That is, high-speed impedance matching is performed at 2 msec and the driving frequency is recovered at 100 msec.

In case of a plasma process having a multi-step recipe, each step may conventionally have a plasma state that is equal to or less than several seconds. Thus, if impedance matching is performed within 2 msec and a frequency is recovered within 100 msec, process stability may be significantly improved.

In case of a plasma process using pulse plasma, pulse width is conventionally less than several microseconds (msec). Therefore, according to an embodiment of the present disclosure, impedance matching is performed within the pulse width. A driving frequency may be recovered after a plurality of pulse sequences has passed. Thus, process stability and process reproducibility are improved.

Figure 15:
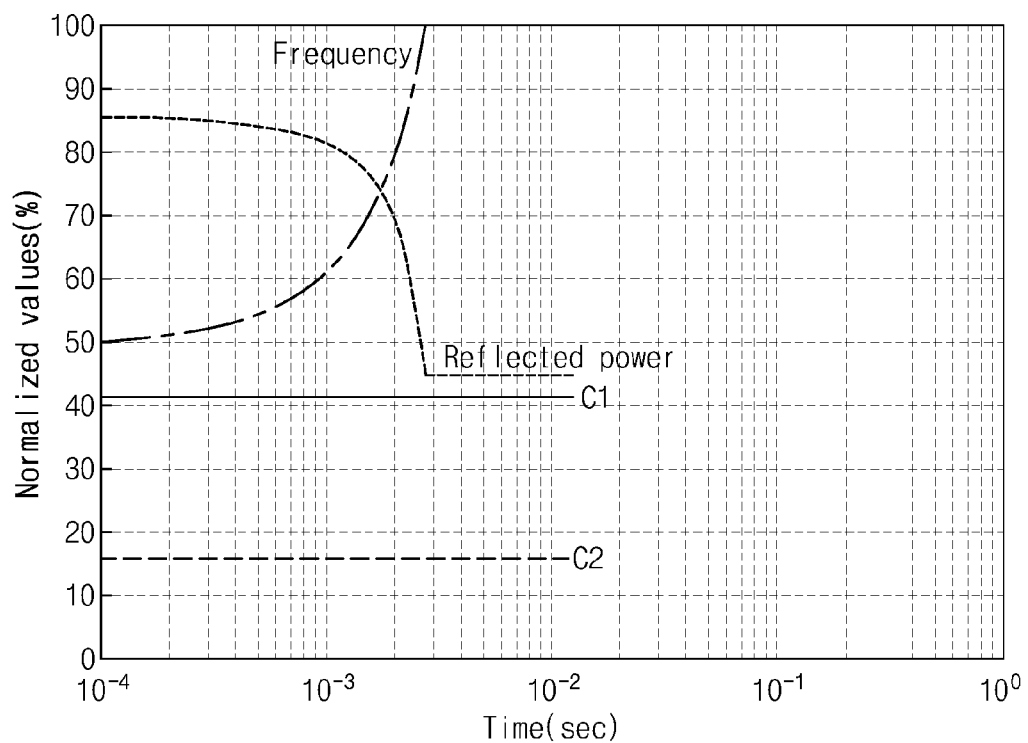

FIG. 15 is a graph showing conditions of impedance matching only using a frequency variable RF power source when the impedance matching is impossible only with the frequency variable RF power source.

Referring to FIG. 15, conditions used in the simulation was as follows. A first fixed inductor was 100 nH, a second fixed inductor was 500 nH, a variable range of a first variable capacitor was between 150 pF and 1000 pF, and a variable range of a second variable capacitor was between 85 pF and 500 pF. For frequency variable impedance matching, the first variable capacitor was used to be fixed to 500 pF, and the second variable capacitor was used to be fixed to 150 pF. A time interval of a control loop is 100 μsec. A frequency variation algorithm increases the driving frequency when an imaginary part of a reflection coefficient has a positive value and decreases the driving frequency when the imaginary part of the reflection coefficient has a negative value.

According to a result of the simulation, impedance matching cannot be performed within a frequency variable range. Thus, the frequency variable RF power source cannot be used when the range of a plasma load is wide.

Figure 16:
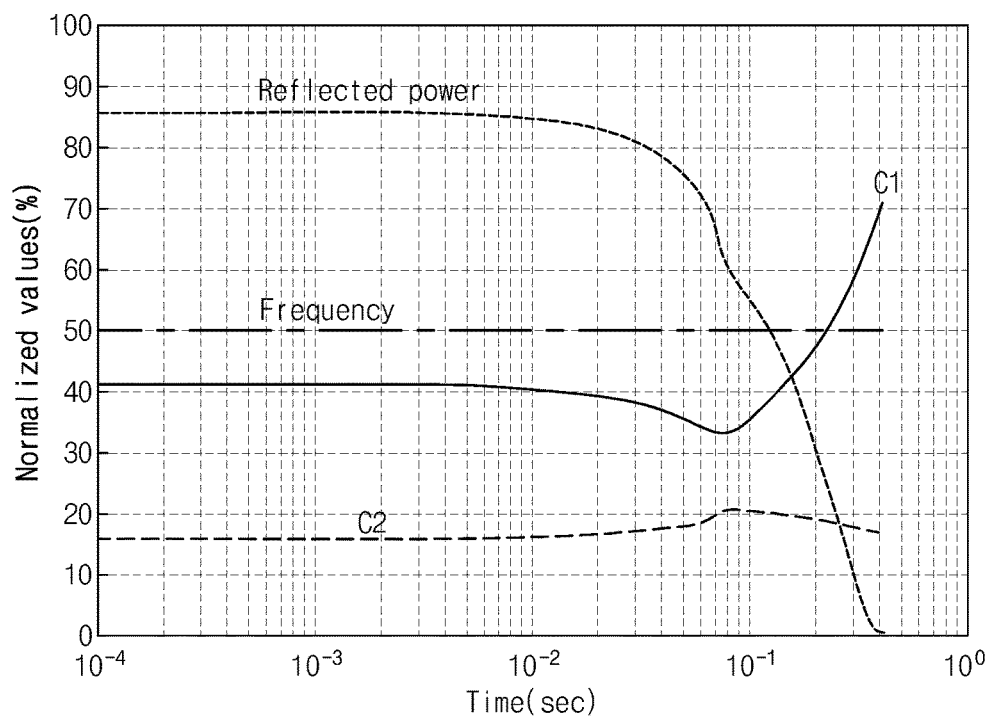

FIG. 16 is a graph showing conditions of impedance matching only using a variable reactive component at a fixed driving frequency when the impedance matching is impossible only with the frequency variable RF power source.

Referring to FIG. 16, conditions used in the simulation was as follows. A first fixed inductor was 100 nH, a second fixed inductor was 500 nH, a variable range of a first variable capacitor was between 150 pF and 1000 pF, and a variable range of a second variable capacitor was between 85 pF and 500 pF. An initial condition of the first variable capacitor was 500 pF, and an initial condition of the second variable capacitor was 150 pF. The Equation (16) was used for impedance matching.

Time taken for reflected power to decrease below 50 percent is about 100 msec. In addition, about 400 msec is required for impedance matching. Therefore, in case of a plasma process having a multi-step, each step may conventionally have a plasma state that is equal to or less than several seconds. As a result, it is difficult to ensure process stability and process reproducibility.

Figure 17:
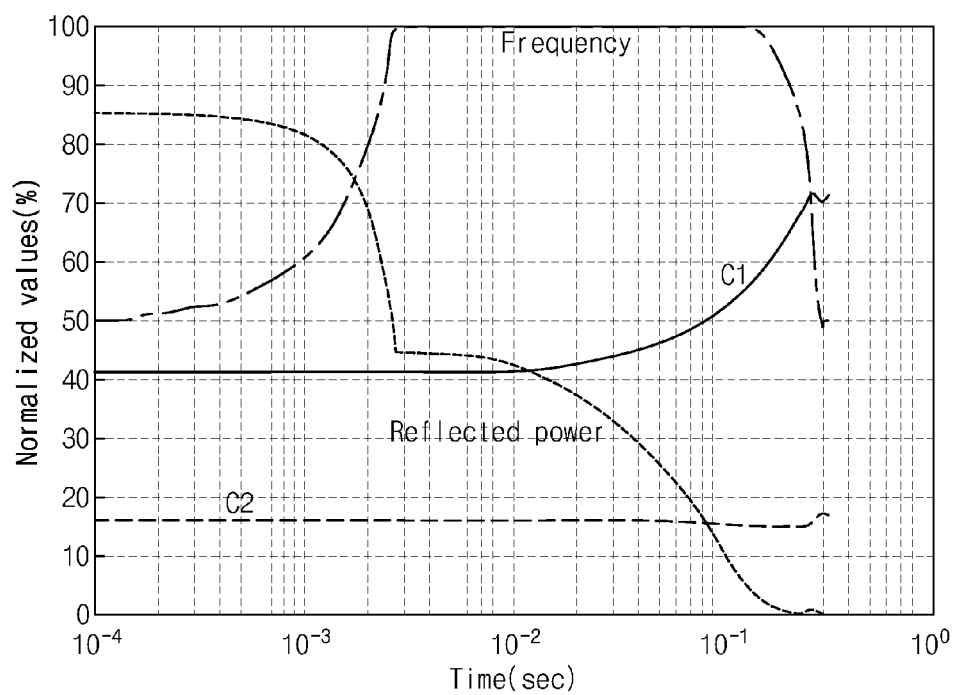

FIG. 17 is a graph showing conditions of impedance matching adopting an algorithm to recover a driving frequency to a target driving frequency by simultaneously using a frequency variable RF power source and a variable reactive component when the impedance matching is impossible only with the frequency variable RF power source.

Referring to FIG. 17, conditions used in the simulation was as follows. A first fixed inductor was 100 nH, a second fixed inductor was 500 nH, a variable range of a first variable capacitor was between 150 pF and 1000 pF, and a variable range of a second variable capacitor was between 85 pF and 500 pF. An initial condition of the first variable capacitor was 500 pF, and an initial condition of the second variable capacitor was 150 pF. An initial condition of a driving frequency is 50 percent. A time interval of a control loop is 100 μsec. A frequency variation algorithm increases the driving frequency when an imaginary part of a reflection coefficient has a positive value and decreases the driving frequency when the imaginary part of the reflection coefficient has a negative value. The Equation (18) was used for impedance matching and frequency recovery.

About 300 msec is required for impedance matching. However, time taken for reflected power to decrease less than 50 percent is about 3 msec through a frequency variation algorithm. Thus, the impedance matching is performed using a reactive component while the reflection power is minimized using the frequency variation algorithm. At the same time, the driving frequency converges into a target driving frequency.

Accordingly, even when the range of a plasma load is very wide, impedance matching and driving frequency recovery may be performed while keeping the reflected power within a predetermined range. Thus, the impedance matching is performed at higher speed than when impedance matching is performed only with a reactive component. Moreover, time required for accomplishing reflected power of 500 percent or less may be significantly reduced.

As described so far, an impedance matching system according to an embodiment of the present disclosure can provide high-speed impedance matching and can converge a driving frequency to a constant value (target driving frequency) to improve plasma process stability and plasma process reproducibility.

Although the present disclosure has been described in connection with the embodiment of the present disclosure illustrated in the accompanying drawings, it is not limited thereto. It will be apparent to those skilled in the art that various substitutions, modifications and changes may be made without departing from the scope and spirit of the present disclosure.

What is claimed is:

1. An impedance matching method of a variable reactance impedance matching network disposed between a frequency variable RF power source to vary a driving frequency f and a load, the impedance matching method comprising:
performing a first impedance matching by measuring a first electrical characteristic at an output of a frequency variable RF power source, checking an impedance matching state using the first electrical characteristic at the frequency variable RF power source, and changing a driving frequency of the frequency variable RF power source; and
controlling a variation amount of a capacitance or an inductance of a variable reactive component of the impedance matching network as a function of a difference between a target driving frequency $f_t$ and the driving frequency f for inducing the frequency variable RF power source to operate at the target driving frequency.

2. The impedance matching method as set forth in claim 1, wherein the variation amount of the capacitance or the inductance of the variable reactive component is additionally dependent on a function of a reflection coefficient or impedance for impedance matching.

3. The impedance matching method as set forth in claim 2, wherein the variable reactive component includes a first capacitor and a second capacitor, and
wherein variation amounts $dC_1$ and $dC_2$ of a first capacitance $C_1$ of the first capacitor and a second capacitance $C_2$ of the second capacitor satisfy a condition as below, $$\begin{pmatrix} dC_1 \\ dC_2 \end{pmatrix} = \begin{pmatrix} A \\ B \end{pmatrix} - \frac{d\omega}{\omega}\begin{pmatrix} C_1 \\ C_2 \end{pmatrix}$$

where A and B are parameters depending on a reflection coefficient or impedance, and dω represents a difference between a target driving angular frequency ($\omega_t=2\pi f_t$) and a driving angular frequency ($\omega=2\pi f$).

4. The impedance matching method as set forth in claim 3, wherein the variation amounts $dC_1$ and $dC_2$ of the first capacitance $C_1$ of the first capacitor and the second capacitance $C_2$ of the second capacitor satisfy a condition as below, $$\begin{pmatrix} dC_1 \\ dC_2 \end{pmatrix} = g_1\begin{pmatrix} A \\ B \end{pmatrix} - g_2\frac{d\omega}{\omega}\begin{pmatrix} C_1 \\ C_2 \end{pmatrix}$$

where $g_1$ represents a first weighting function and $g_2$ represents a second weighting function,
wherein the first weighting function is an increasing function of a reflection coefficient, and
wherein the second weighting function is a decreasing function of the reflection coefficient.

5. The impedance matching method as set forth in claim 2, wherein the step in which the variation amount of the capacitance or the inductance of the variable reactive component is dependent on a function of a reflection coefficient or impedance for impedance matching comprises:
extracting a characteristic vector;
transforming a device vector indicating reactance of a variable reactive component into an analysis vector using a predetermined transformation matrix and expressing the characteristic vector on an analysis coordinate system using the analysis vector as a coordinate axis;
analyzing the characteristic vector on the analysis coordinate system to extract a displacement vector for impedance matching;
transforming the displacement vector into a reduced device vector using the transformation matrix; and
extracting variation amount of capacitance or inductance using the reduced device vector.

6. The impedance matching method as set forth in claim 1, wherein the variable reactive component includes a first capacitor and a second capacitor, and
wherein variation amounts $dC_1$ and $dC_2$ of a first capacitance $C_1$ of the first capacitor and a second capacitance $C_2$ of the second capacitor satisfy a condition as below, $$\begin{pmatrix} dC_1 \\ dC_2 \end{pmatrix} = -\frac{d\omega}{\omega}\begin{pmatrix} C_1 \\ C_2 \end{pmatrix}$$

where dω represents a difference between a target driving angular frequency ($\omega_t=2\pi f_t$) and a driving angular frequency ($\omega=2\pi f$).

7. The impedance matching method as set forth in claim 1, wherein the variable reactive component includes a first capacitor and a second capacitor, and
wherein variation amounts $dC_1$ and $dC_2$ of a first capacitance $C_1$ of the first capacitor and a second capacitance $C_2$ of the second capacitor satisfy a condition as below, $$\begin{pmatrix} dC_1 \\ dC_2 \end{pmatrix} = -\frac{d\omega}{\omega}\begin{pmatrix} K_1 \\ K_2 \end{pmatrix}$$

where $K_1$ is a constant, $K_2$ is a constant, and dω represents a difference between a target driving angular frequency ($\omega_t=2\pi f_t$) and a driving angular frequency ($\omega=2\pi f$).

8. The impedance matching method as set forth in claim 1, wherein the variation amount of the capacitance or the inductance of the variable reactive component is controlled to have a negative value when a difference between a target driving frequency $f_t$ and the driving frequency f has a positive value, and
wherein the variation amount of the capacitance or the inductance of the variable reactive component is controlled to have a positive value when a difference between a target driving frequency $f_t$ and the driving frequency f has a negative value.

9. The impedance matching method as set forth in claim 1, wherein the frequency variable RF power source performs impedance matching by varying a driving frequency, and
wherein the frequency variable RF power source increases the driving frequency when an imaginary part of a reflection coefficient has a positive value and decreases the driving frequency when the imaginary part of the reflection coefficient has a negative value.

10. The impedance matching method as set forth in claim 1, wherein the frequency variable RF power source performs impedance matching by varying the driving frequency, and
wherein the frequency variable RF power source performs impedance matching by scanning the driving frequency.

11. A control method of an RF system, comprising:
performing first impedance matching by measuring electrical characteristics at an output of a frequency variable RF power source and varying a driving frequency using the measured electrical characteristics; and
disposing an impedance matching network, including a variable reactive component between the frequency variable RF power source and a load, for changing a capacitance or an inductance of the variable reactive components,
wherein a variation amount of the capacitance or the inductance of the variable reactive component is given as a function between a target driving frequency $f_t$ and the driving frequency f for inducing the frequency variable RF power source to operate at the target driving frequency.

12. The control method as set forth in claim 11, further comprising:
calculating a prediction driving frequency $f_p$ and providing the calculated prediction driving frequency $f_p$ to the frequency variable RF power source.

13. The control method as set forth in claim 12, wherein the variable reactive component includes a first capacitor and a second capacitor, wherein a prediction driving angular frequency $\omega_p$ is given as below, $$\omega_p = \omega - \omega\left(\frac{dC_1}{C_1} + \frac{dC_2}{C_2}\right)$$

where $\omega_p$ represents a prediction driving angular frequency ($\omega_p=2\pi f_p$), ω represents a driving angular frequency ($\omega=2\pi f$), $C_1$ represents first capacitance of the first capacitor, and $C_2$ represents second capacitance of the second capacitor, and
wherein $dC_1$ is a variation amount of a first capacitance $C_1$ of the first capacitor and $dC_2$ is a variation amount of a second capacitance $C_2$ of the second capacitor.

14. The control method as set forth in claim 11, wherein the variation amount of the capacitance or the inductance of the variable reactive component is dependent on a function of a reflection coefficient or impedance for impedance matching.

15. The control method as set forth in claim 14, the step in which the variation amount of the capacitance or the inductance of the variable reactive component is dependent on a function of a reflection coefficient or impedance for impedance matching comprises:
extracting a characteristic vector;
transforming a device vector indicating reactance of a variable reactive component into an analysis vector using a predetermined transformation matrix and expressing the characteristic vector on an analysis coordinate system using the analysis vector as a coordinate axis;
analyzing the characteristic vector on the analysis coordinate system to extract a displacement vector for impedance matching;
transforming the displacement vector into a reduced device vector using the transformation matrix; and
extracting variation amount of capacitance or inductance using the reduced device vector.

16. The control method as set forth in claim 11, wherein the variable reactive component includes a first capacitor and a second capacitor, and
wherein variation amounts $dC_1$ and $dC_2$ of a first capacitance $C_1$ of the first capacitor and a second capacitance $C_2$ of the second capacitor satisfy a condition as below, $$\begin{pmatrix} dC_1 \\ dC_2 \end{pmatrix} = \begin{pmatrix} A \\ B \end{pmatrix} - \frac{d\omega}{\omega}\begin{pmatrix} C_1 \\ C_2 \end{pmatrix}$$

where A and B are parameters depending on a reflection coefficient or impedance, and dω represents a difference between a target driving angular frequency ($\omega_t=2\pi f_t$) and a driving angular frequency ($\omega=2\pi f$).

17. The control method as set forth in claim 16, wherein the variation amounts $dC_1$ and $dC_2$ of the first capacitance $C_1$ of the first capacitor and the second capacitance $C_2$ of the second capacitor satisfy a condition as below, $$\begin{pmatrix} dC_1 \\ dC_2 \end{pmatrix} = g_1\begin{pmatrix} A \\ B \end{pmatrix} - g_2\frac{d\omega}{\omega}\begin{pmatrix} C_1 \\ C_2 \end{pmatrix}$$

where $g_1$ represents a first weighting function and $g_2$ represents a second weighting function, wherein the first weighting function is an increasing function of a reflection coefficient, and wherein the second weighting function is a decreasing function of the reflection coefficient.

18. The control method as set forth in claim 11, wherein the variable reactive component includes a first capacitor and a second capacitor, and wherein variation amounts $dC_1$ and $dC_2$ of a first capacitance $C_1$ of the first capacitor and a second capacitance $C_2$ of the second capacitor satisfy a condition as below, $$\begin{pmatrix} dC_1 \\ dC_2 \end{pmatrix} = -\frac{d\omega}{\omega} \begin{pmatrix} C_1 \\ C_2 \end{pmatrix}$$

where $d\omega$ represents a difference between a target driving angular frequency ($\omega_t = 2\pi f_t$) and a driving angular frequency ($\omega = 2\pi f$).

19. An impedance matching method of a variable reactance impedance matching network disposed between a frequency variable RF power source to vary a driving frequency f and a load, the impedance matching method comprising:

changing capacitance or inductance of a variable reactive component of the impedance matching network such that the frequency variable RF power source is induced to operate at a target frequency driving frequency.

20. The impedance matching method as set forth in claim 19, wherein variation amount of capacitance or inductance of a variable reactive component of the impedance matching network is controlled as a function of a difference between a target driving frequency $f_t$ and the driving frequency f.

21. The control method as set forth in claim 19, further comprising:

calculating a prediction driving frequency $f_p$ and providing the calculated prediction driving frequency $f_p$ to the frequency variable RF power source.

22. An impedance matching method of an RF power system including a frequency variable RF power source and an impedance matching network transferring an output of the frequency variable RF power source to a load, the impedance matching method comprising:

measuring a first electrical characteristic at an output terminal of the frequency variable RF power source;

checking an impedance matching state using the first electrical characteristics by the frequency variable RF power;

varying a driving frequency of the frequency variable RF power source;

measuring a second electrical characteristic at the impedance matching network;

checking an impedance matching state using the second electrical characteristic at the impedance matching network and checking whether a driving frequency is a target driving frequency;

calculating first variation amount of inductance or capacitance of variable reactive component for impedance matching when impedance matching is not performed at the impedance matching network;

calculating second variation amounts of inductance or capacitance of the variable reactive component for varying the driving frequency at the impedance matching network when the driving frequency does not match a target driving frequency; and calculating the total variation amounts caused by the first variation amount and the second variation amount and controlling the variable reactive component using the total variation amounts.

23. An impedance matching method of an RF power system including a frequency variable RF power source and an impedance matching network transferring an output of the frequency variable RF power source to a load, the impedance matching method comprising:

measuring a first electrical characteristic at an output terminal of the frequency variable RF power source;

checking an impedance matching state using the first electrical characteristic by the frequency variable RF power source;

varying a driving frequency of the frequency variable RF power source;

checking whether the driving frequency is a target driving frequency;

calculating first variation amount of inductance or capacitance of a variable reactive component for impedance matching when impedance matching is not performed;

calculating second variation amount of inductance or capacitance of a variable reactive component for varying a driving frequency when the driving frequency does not match the target driving frequency; and calculating total variation amount of the first variation amount and the second variation amount and controlling the variable reactive component using the total variation amount.

24. An impedance matching method of an RF power system including a frequency variable RF power source and an impedance matching network transferring an output of the frequency variable RF power source to a load, the impedance matching method comprising:

measuring first electrical characteristics at an output terminal of the frequency variable RF power source;

checking an impedance matching state using the first electrical characteristics by the frequency variable RF power source;

varying a driving frequency of the frequency variable RF power source;

measuring a second electrical characteristic by the impedance matching network;

checking an impedance matching state using the second electrical characteristic by the impedance matching network;

calculating a first variation amount of inductance or capacitance of a variable reactive component for impedance matching; and controlling the variable reactive component using the first variation amount.

25. An RF power system comprising:

a frequency variable RF power source having a predetermined frequency variable range and varying a driving frequency to perform impedance matching; and an impedance matching network receiving an output from the frequency variable RF power source and transferring the output to a load, wherein the impedance matching network changes capacitance or inductance of a variable reactive component of the impedance matching network such that the frequency variable RF power source is induced to operate at a target driving frequency.

* * * * *